United States Patent
Partel et al.

(10) Patent No.: US 11,156,579 B2
(45) Date of Patent: Oct. 26, 2021

(54) ELECTRODE STRUCTURE AND METHOD OF MANUFACTURING AN ELECTRODE STRUCTURE

(71) Applicants: Albert-Ludwigs-Universitaet Freiburg, Freiburg (DE);
Fachhochschule Vorarlberg GmbH, Dornbirn (AT)

(72) Inventors: Stefan Partel, Bildstein (AT); Stephan Kasemann, Feldkirch (AT); Can Dincer, Freiburg (DE); Jochen Kieninger, Freiburg (DE); Gerald Urban, Freiburg (DE)

(73) Assignees: Albert-Ludwigs-Universitaet Freiburg, Freiburg (DE);
Fachhochschule Vorarlberg GmbH, Dornbirn (AT)

(*) Notice: Subject to any disclaimer, the term of this patent is extended or adjusted under 35 U.S.C. 154(b) by 508 days.

(21) Appl. No.: 15/847,474

(22) Filed: Dec. 19, 2017

(65) Prior Publication Data
US 2018/0106749 A1 Apr. 19, 2018

Related U.S. Application Data

(63) Continuation of application No. PCT/EP2016/063078, filed on Jun. 8, 2016.

(30) Foreign Application Priority Data

Jun. 19, 2015 (DE) .................. 10 2015 211 392.2

(51) Int. Cl.
*C23C 14/08* (2006.01)
*G01N 27/30* (2006.01)
(Continued)

(52) U.S. Cl.
CPC ......... *G01N 27/307* (2013.01); *C23C 14/028* (2013.01); *C23C 14/08* (2013.01);
(Continued)

(58) Field of Classification Search
CPC ............................ C23C 14/08; C23C 14/028
See application file for complete search history.

(56) References Cited

U.S. PATENT DOCUMENTS

| 5,137,817 A | 8/1992 | Busta et al. |
| 6,423,567 B1 | 7/2002 | Luedemann et al. |

(Continued)

FOREIGN PATENT DOCUMENTS

| DE | 19819200 A1 | 11/1999 |
| KR | 20070043591 A | 4/2007 |

OTHER PUBLICATIONS

Beck, M. et al., "Nanoelectrochemical transducers for (bio-) chemical sensor applications fabricated by nanoimprint lithography", Microelectron. Eng., vol. 73-74, pp. 837-842, 2004, Apr. 9, 2004, 837-842.

(Continued)

*Primary Examiner* — Jason Berman
(74) *Attorney, Agent, or Firm* — Michael A. Glenn; Perkins Coie LLP

(57) ABSTRACT

A method of manufacturing an electrode structure includes providing an initial structure, the initial structure including at least two elevated regions extending from a substrate, wherein top portions of the two elevated regions are separated by a first lateral distance, depositing material onto the elevated regions by means of physical vapor deposition such that adjacent top portions of the deposited material are separated by a second lateral distance that is smaller than the first lateral distance, and applying electrodes onto the top portions of the material.

12 Claims, 20 Drawing Sheets

(51) Int. Cl.

| | |
|---|---|
| *C23C 14/02* | (2006.01) |
| *C23C 14/10* | (2006.01) |
| *C23C 14/14* | (2006.01) |
| *C23C 14/24* | (2006.01) |
| *C23C 14/34* | (2006.01) |
| *G01N 27/327* | (2006.01) |
| *G03F 7/16* | (2006.01) |

(52) U.S. Cl.
CPC .............. *C23C 14/10* (2013.01); *C23C 14/14* (2013.01); *C23C 14/24* (2013.01); *C23C 14/34* (2013.01); *G01N 27/327* (2013.01); *G03F 7/16* (2013.01)

(56) References Cited

U.S. PATENT DOCUMENTS

| | | | |
|---|---|---|---|
| 8,449,782 B2* | 5/2013 | Lim | H01L 31/188 216/24 |
| 2005/0208767 A1* | 9/2005 | Ding | H01L 21/02266 438/685 |
| 2009/0008787 A1 | 1/2009 | Wenham et al. | |
| 2009/0127097 A1* | 5/2009 | Chen | C23C 14/345 204/192.12 |
| 2009/0215156 A1 | 8/2009 | Chung et al. | |
| 2012/0098144 A1 | 4/2012 | Kim et al. | |

OTHER PUBLICATIONS

Berglund, C. N. et al., "Undercut Isolation—A Technique for Closely Spaced and Self-Aligned Metalization Patterns for MOS Integrated Circuits", Journal of the Electrochemical Society, 1973, vol. 120, No. 9, pp. 1255-1260, ISSN 0013-4651, Sep. 1993, 1255-1260.

Del Campo, Francisco J. et al., "Determination of heterogeneous electron transfer rate constants at interdigitated nanoband electrodes fabricated by an optical mix-and-match process", J. Micromechanics Microengineering, vol. 23, No. 3, p. 035002, 2013, Dec. 26, 2013, 86-95.

Lanyon, Yvonne H. et al., "Recessed nanoband electrodes fabricated by focused ion beam milling", Sens. Actuators B Chem., vol. 121, No. 1, pp. 341-347, 2007, Dec. 19, 2006, 341-347.

Metters, Jonathan P. et al., "Electroanalytical properties of screen printed graphite microband electrodes", Sens. Actuators B Chem., vol. 169, pp. 136-143, 2012, Apr. 28, 2012, 136-143.

Partel, S. et al., "Fabrication process development for a high sensitive electrochemical IDA sensor", Microelectron. Eng., vol. 97, No. 0, pp. 235-240, 2012, Apr. 20, 2012, 235-240.

Partel, S. et al., "Novel fabrication process sub-micron interdigitated electrode arrays for highly sensitive electrochemical detection", Sens. Actuators B Chem., vol. 205, pp. 193-198, 2014, Aug. 29, 2014, 193-198.

Partel, Stefan et al., "Lift-Off Free Fabrication Approach for Periodic Structures with Tunable Nano Gaps for Interdigitated Electrode Arrays", ACS Nano, vol. 10, No. 1, Dec. 1, 2015, pp. 1086-1092, XP055293491, 1086-1092.

Samarao, Ashwin K. et al., "Rapid Fabrication of a Nano Interdigitated Array Electrode and its Amperometric Characterization as an Electrochemical Sensor", Sens. 2007 IEEE, pp. 644-647, 2007, 644-647.

Sandison, Mairi E., "Nanofabrication of electrode arrays by electron-beam and nanoimprint lithographies", Lab. Chip, vol. 6, No. 8, p. 1020, 2006, Jun. 21, 2006, 1020-1025.

Santshi, CH et al., "Interdigitated 50 nm Ti electrode arrays fabricated using XeF2 enhanced focused ion beam etching", Nanotechnology, vol. 17, No. 11, pp. 2722-2729, 2006, May 16, 2006, 2722-2729.

Shim, Joon S. et al., "A large area nano-gap interdigitated electrode array on a polymer substrate as a disposable nano-biosensor", J. Micromechanics Microengineering, vol. 23, No. 3, p. 035002, 2013, Jan. 24, 2013, 1-6.

Skjolding, LHD et al., "Characterisation of nano-interdigitated electrodes", J. Phys. Conf. Ser., vol. 100, No. 5, p. 052045, 2008, 2008, 1-4.

Stadler, Brigitte et al., "Nanopatterning of gold colloids for label-free biosensing", Nanotechnology, vol. 18, No. 15, p. 155306, 2007, Mar. 9, 2007, 1-6.

Tan, Fang et al., "Electroanalytical applications of screen printed microelectrode arrays", Sens. Actuators B Chem., vol. 181, pp. 454-462, 2013, Feb. 18, 2013, 454-462.

Ueno, Kosei et al., "Fabrication and electrochemical characterization of interdigitated nanoelectrode arrays", Electrochem. Commun., vol. 7, No. 2, pp. 161-165, 2005, Dec. 9, 2004, 161-165

Van Gerwen, Peter et al., "Nanoscaled interdigitated electrode arrays for biochemical sensors", Sens. Actuators B Chem., vol. 49, No. 1-2, pp. 73-80, 1998, Mar. 3, 1998, 73-80.

Welford, Peter J. et al., "Laminated Microelectrodes: A Simple Approach to the Construction of Inexpensive Microelectrodes with a Variety of Geometries", Anal. Chem., vol. 73, No. 24, pp. 6088-6092, Dec. 2001, Nov. 17, 2001, 6088-6092.

Yokoo, Atsushi et al., "Nanoelectrode Lithography", MRS Proc., vol. 961, 2007, 2007.

* cited by examiner

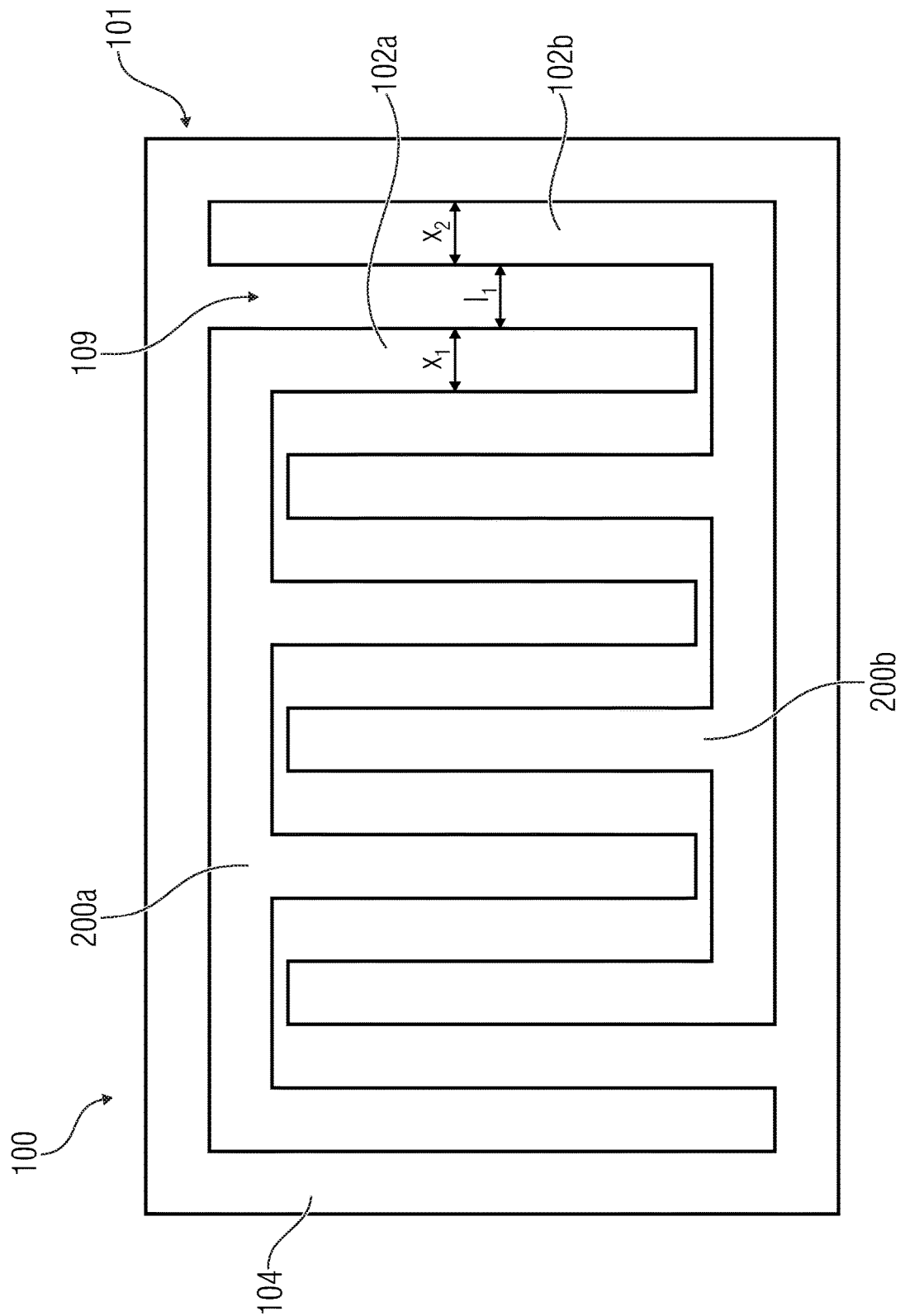

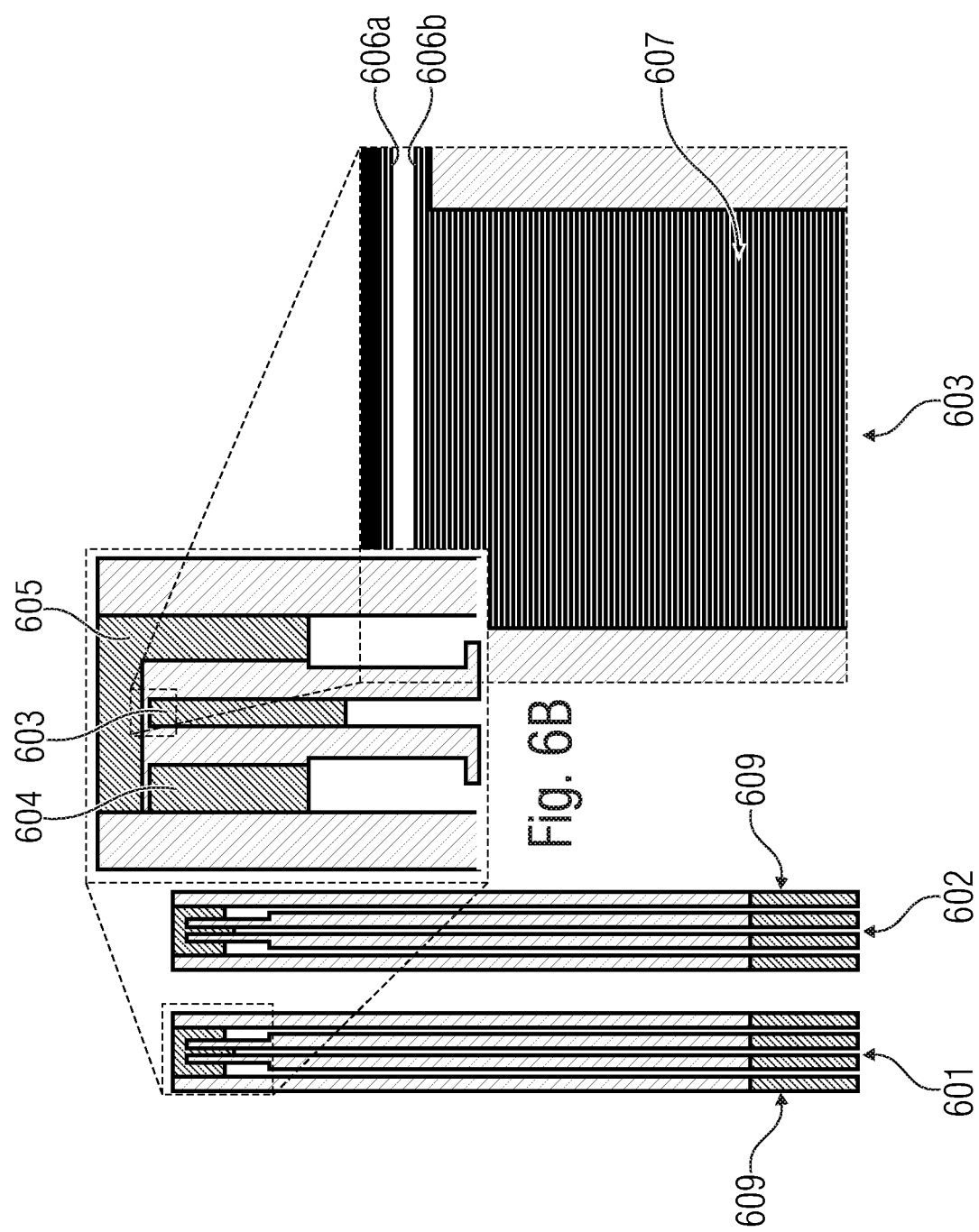

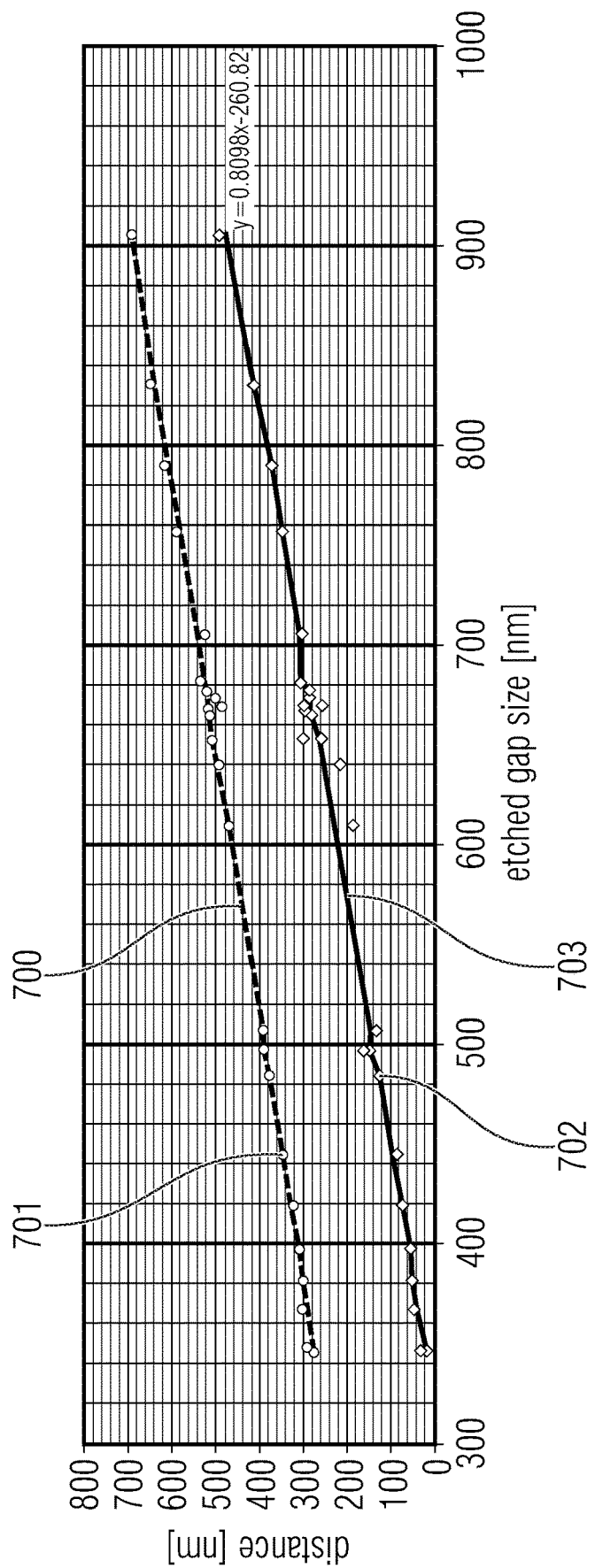

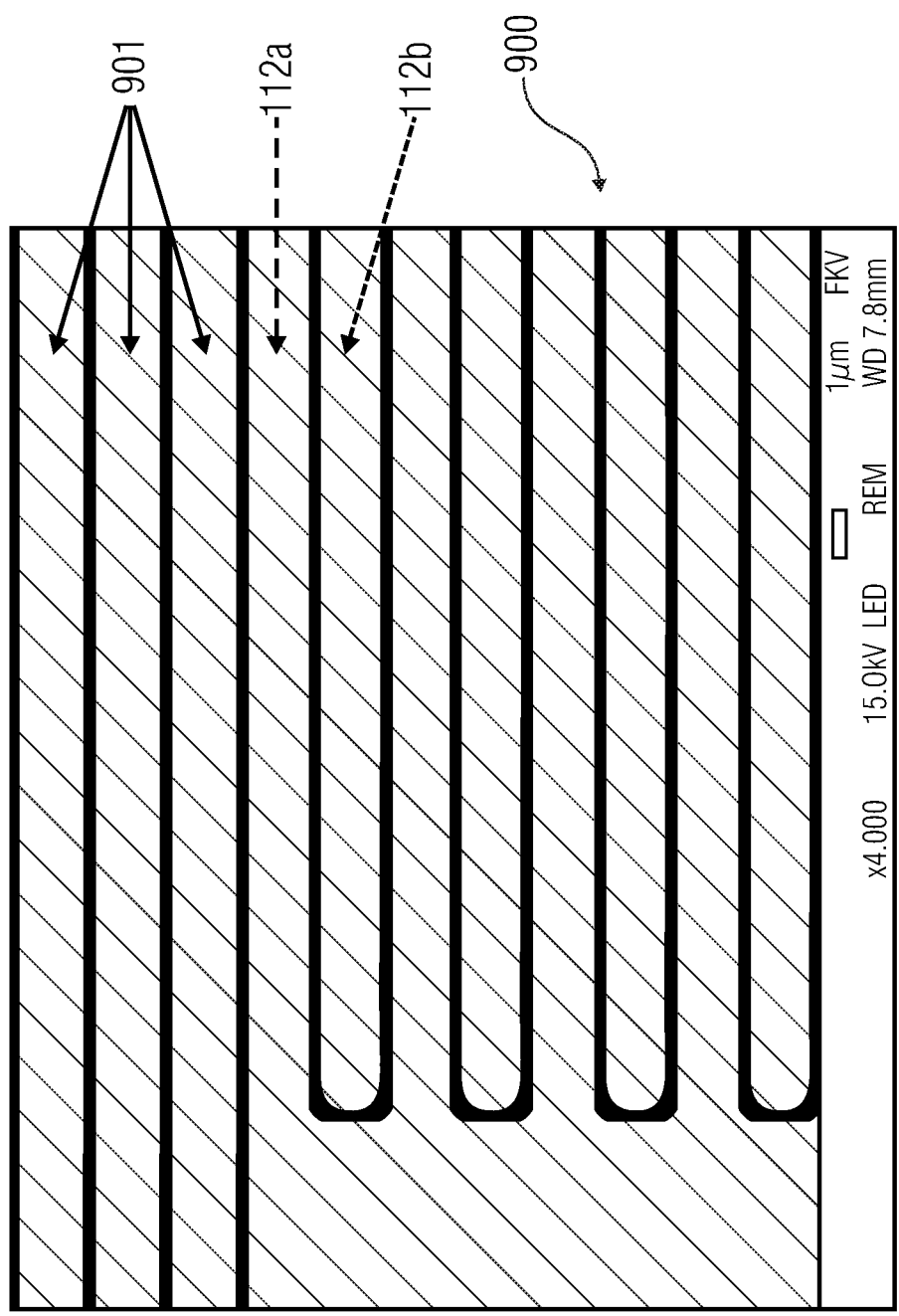

ELECTRODE STRUCTURE AND METHOD OF MANUFACTURING AN ELECTRODE STRUCTURE

CROSS-REFERENCES TO RELATED APPLICATIONS

This application is a continuation of copending International Application No. PCT/EP2016/063078, filed Jun. 8, 2016, which is incorporated herein by reference in its entirety, and additionally claims priority from German Application No. DE 10 2015 211 392.2, filed Jun. 19, 2015, which is incorporated herein by reference in its entirety.

Embodiments of the present invention relate to a method of manufacturing an electrode structure according to independent claim 1. Further embodiments of the present invention relate to an electrode structure with the features of independent claim 15, and to a biosensor comprising said electrode structure.

BACKGROUND OF THE INVENTION

A biosensor is an analytical device that allows detecting a biological component. The device consists of a sensitive biological element that interacts with the analyte, an element that transfers the signal of the biological element into a more easily measured signal and a signal processing unit that displays the result. The transfer of the biological interaction of an event into measured signal is called transducer.

There are several types of transducers: electrochemical, optical, electronic, piezoelectric, pyroelectric and gravimetric. One of the most common techniques to transfer the biological event into a measurable signal is electrochemical. Electrochemical sensors have several advantages: They are highly sensitive, rapid, inexpensive, and the sensor produces an electrical signal that is proportional to the analyte concentration. Different detection methods are possible to recognize the electrochemical changes and they can be classified into amperometric, potentiometric, impedance and conductometric. This electrochemical transducer contains three electrodes, a working electrode, a counter electrode and a reference electrode.

To enhance the sensitivity of the conventional electrodes and to obtain low capacitive currents and small resistance effects, interdigitated electrode arrays (IDA or IDE) also known as microband electrodes or interdigitated array microelectrodes (IDAM) are mostly employed in electrochemistry. The fabrication technique presented in this invention can also be applied to produce different geometries for a device that can be used as surface acoustic wave (SAW) or mechanical cantilever or to contact nanowires.

Different fabrication methods are used to fabricate these electrode arrays. If the electrode size is in the micrometer range, screen printing, laminating and mask aligner lithography is reported as an initial structuring method [1] to [5]. In this case, the electrode size is typically in the range of 200 μm down to 4 μm. When the electrode size shrinks down to submicron and nanometer sizes, more advanced technologies may be used such as e-beam, focused ion beam, nano imprint, deep ultra violet-, extreme ultra violet- or projection photolithography [6] to [16]. Even the provision of self-assembled monolayers (SAM) would be possible to generate the IDA pattern but it involves a pattern transfer.

However, these conventional processes are expensive, and some are time consuming and place specific requirements on the substrate and photoresist. For all nano IDAs the fabrication techniques (except focused ion beam) are a combination of a high resolution patterning method and a subsequent lift-off process. In all these techniques the most critical step is the lift-off process which has to be successful without any redeposition to obtain high yields. This can be achieved when the profile of the pattern shows a negative flank (slope) angle, otherwise the side slopes get coated with the conductive electrode material during evaporation.

Also double layer techniques are used to create an undercut. Consequently, specific requirements regarding the photoresist profile are mandatory. It is even more difficult to get a sufficient undercut when the finger patterns are in the nanometer range. The demands on process reliability and stability are increasing with the shrinking gaps between the fingers.

Also an alternative method is mentioned by Shim [17], which is a combination of mask aligner lithography and wet etching step. The lithography step acts as a wet etching mask as well as a self-aligned mask for a subsequent metal evaporation step. In the wet etching step the under etch rate is controlled, and as a consequence the gap between the two metal layers can be controlled. He showed that gap sizes down to 250 nm with an electrode width of more than 10 μm are possible but with low yield. He also showed that alternative substrate materials like polymers are possible which makes it suitable for mass production. Unfortunately, the process has some disadvantages. The line edge roughness is very high due to the fact that controlling the wet etching step is difficult. The fabrication of gaps below 250 nm is rather critical. Furthermore, the fabrication process includes a lift-off process which lowers the yield as well.

SUMMARY

According to an embodiment, a device of manufacturing an electrode structure may have the steps of: providing an initial structure, the initial structure including at least two elevated regions extending from a substrate, wherein top portions of the two elevated regions are separated by a first lateral distance, depositing material by means of physical vapor deposition onto the elevated regions such that adjacent top portions of the deposited material are separated by a second lateral distance that is smaller than the first lateral distance, and applying electrodes onto the top portions of the material.

According to another embodiment, an electrode structure may have: an initial structure, the initial structure including at least two elevated regions extending from a substrate, wherein top portions of the two elevated regions are separated by a first lateral distance, a material deposited onto the elevated regions by means of physical vapor deposition, wherein adjacent top portions of the material are separated by a second lateral distance that is smaller than the first lateral distance, and electrodes applied onto the top portions of the material.

According to another embodiment, a biosensor chip may have the inventive electrode structure.

According to the inventive method, it is possible to generate gaps between adjacent electrodes in the nanometer range without any lift-off process. Thus, the present invention allows for mass production of, e.g. interdigitated electrode arrays with adjustable nanogaps without any lift off process. Therefore, very high yield and precision is possible. Furthermore, the initial structure may be in the micrometer range and a variety of patterning techniques may be used to provide the initial structure. The initial structure may be realized by lithography or any other structuring technique, for example injection molding with an appropriate stamp.

Various substrate materials may be employed, such as silicon, pyrex or polymers. Even a photoresist may be used as initial structure. Another major advantage is that the electrode gap, i.e. the lateral distance between the electrodes, can be controlled primarily by deposition thickness, and adjusting the lateral distance between the adjacent top portions of the deposited material is possible independently of the mask or stamp pattern. Therefore, different lateral distances of adjacent top portions of the deposited material and, thus, different electrode gap sizes can be produced with only one mask on a later state.

For example, the step of depositing material onto the elevated regions may comprise sputtering material onto the elevated regions. A sputtering process is well controllable such that the thickness of the deposited material, the related gap width, the electrode gap and the Line Width Roughness may be adjusted as desired within the range of nanometers.

The material that is deposited onto an elevated region may comprise a first lateral width adjacent to the elevated region and a second lateral width remote from the elevated region, wherein the first lateral width is smaller than the second lateral width. Accordingly, the material that is deposited onto each of the elevated regions may comprise a cone-like shape wherein the lateral width decreases from top to bottom. In other words, on each of the elevated regions, the material that is deposited onto the respective one of the elevated region forms an undercut. Thus, a shadowing effect is provided such that less subjects can penetrate into a space between the elevated regions compared to uncovered elevated regions, i.e. compared to a case in which the elevated regions were not covered with deposited material. Furthermore, said cone-shape prevents that the sloped side walls of the deposited material get coated with conductive electrode material.

The elevated regions may be permanently maintained at the initial structure. That is, a lift-off process can be omitted. Accordingly, the inventive concept may avoid the problems and disadvantages of conventional methods using a lift-off process, as mentioned above.

The deposited material may be a dielectric. A dielectric is useful in order to provide a good insulation of the electrodes against each other and against the surroundings, e.g. against the elevated regions or parts of the underlying substrate.

The electrodes may be applied onto the top portions of the deposited material by evaporation of conductive material. An evaporation step may provide an even distribution of the conductive electrode material. Furthermore, a thin film or layer of the conductive electrode material can be provided. This is particularly desirable as the top portions of the deposited material may already comprise a small lateral distance between each other. Thus, by evaporating only a thin layer of conductive electrode material onto the deposited material, said conductive electrode material may not clog the space or gap between the top portions of the deposited material. As the conductive material is provided as a thin and evenly distributed film, the conductive electrode material provided on top of a first elevated region may not come into contact with an adjacent conductive electrode material provided on top of a second elevated region. Thus, a short circuit may be prevented.

The elevated regions may comprise an aspect ratio of width to height of about 1:1. If the width and the height of an elevated region are substantially the same, then the deposited material is deposited on said elevated region in such a way that it comprises a narrow but high cone shape. In other words, an aspect ratio of 1:1 provides a good undercut formed by the deposited material.

The top portions of the elevated regions may comprise a lateral width of about 1 µm and the first lateral distance between the top portions of the elevated regions may be about 1 µm. Accordingly, the top portions of the elevated regions may comprise substantially the same lateral width as the lateral width of the gap between two adjacent elevated regions. Thus, substantially equal distances may be created between adjacent electrodes. This may be particularly useful when providing a plurality of elevated regions wherein each of the plurality of elevated regions is substantially equally distanced from its neighbouring elevated region. Thus, the inventive method provides a high yield.

The first lateral distance between the elevated regions is between about 3 µm and about 1 µm, advantageously between about 1 µm and about 800 nm, and more advantageously between about 800 nm and 500 nm. In other words, the space or gap formed between two adjacent elevated regions may comprise these dimensions. Accordingly, the size of the gaps can be adjusted to achieve good results depending on the choice of the material and the thickness of the material that is to be sputtered onto the elevated regions.

The electrode structure may comprise electrodes that are separated by an electrode gap, the electrode gap comprising a lateral distance that is less than about 100 nm, advantageously less than about 50 nm and more advantageously between about 50 nm and 20 nm. The inventive method allows a mass fabrication with reproducible results which provides electrode structures comprising electrode gaps in the range of nanometers.

The deposited material may comprise a thickness between about 400 nm and about 700 nm. This particular selection of a value range provides surprisingly good results. The deposition process, and in particular a sputtering process, can be precisely controlled, wherein the deposited material covers the elevated regions particularly advantageous within the claimed value range. The gap or the lateral distance between the top portions of the deposited material can be adjusted within tolerances of 10 nanometers and less, when the deposited material comprises a thickness within the claimed range. As mentioned, by varying the thickness of the deposited material, the gap between the electrodes can be adjusted. The thicker the layer of deposited material, the thinner the distance of adjacent electrodes gets. It is a further advantage that the electrode gap adjustment can all be done without changing the mask design, only by changing the conditions of the deposition process. For example longer or shorter sputtering times lead to thicker or thinner layers of deposited material. Thus, the fabrication process according to the inventive method is very flexible when it comes to fabrication of electrode structures with different electrode distances.

The inventive method may further comprise providing a material layer that is arranged between the elevated regions and the deposited material. Accordingly, it may be possible to provide a material layer, e.g. a conductive material, that provides an undercut, followed by depositing a material, e.g. a dielectric, that covers the material layer at least partially. Accordingly, the deposited material may take the shape of the underlying material layer which may already comprise an undercut shape.

The initial structure may be formed by injection molding, or by hot embossing, or by nanoimprinting, or by dry etching, or by wet etching. Different substrate materials like silicon, pyrex or any polymers can be employed. Compared to conventional methods using silicon, glass, ceramics or the like as a substrate and initial structure, the inventive provision of an initial structure that is formed by one of injection molding, hot embossing or nanoimprinting is more time- and cost-effective. This allows for a commercial mass production of electrode structures and biosensors.

Adjacent areas of top portions of deposited material may provide a Line Width Roughness of about 20 nm. Such a Line Width Roughness may enable a good and clearly defined (physical and electrical) separation between two adjacent electrodes. Conventionally, lithography techniques are used for the fabrication of critical dimension in the sub-micron or nanometer range. However, these conventional fabrication techniques may not provide the line width roughness (LWR) that may be used in order to realize structures in ranges smaller than 100 nanometers [17]. According to the present invention, the initial structure that may, for instance, be fabricated by mask aligner lithography and a subsequent dry etching step, has a quite high LWR of about 50 nm. Due to the fact that the sputtering process smoothens out the initial structures LWR, a still better LWR can be realized for the gaps between adjacent electrodes. For example, the LWR for an initial 520 nm structure with an initial LWR of about 50 nm shows a LWR of about 20 nm after the step of depositing material thereon.

According to a further aspect of the invention, an electrode structure is provided which comprises an initial structure, the initial structure comprising at least two elevated regions extending from a substrate, wherein top portions of the two elevated regions are separated by a first lateral distance, a material deposited onto the elevated regions, wherein adjacent top portions of the material are separated by a second lateral distance that is smaller than the first lateral distance, and electrodes applied onto the top portions of the material.

According to a further aspect of the invention, a biosensor chip is provided which comprises the aforementioned electrode structure.

BRIEF DESCRIPTION OF THE DRAWINGS

Embodiments of the present invention will be detailed subsequently referring to the appended drawings, in which:

FIG. 3A shows a top view of an initial electrode structure according to an embodiment of the invention, FIG. 6A shows a picture of a die comprising two biosensor chips according to an embodiment of the invention, FIG. 6B shows a close up of a part of FIG. 6A, FIG. 6C shows a further close up of a part of FIG. 6B, FIG. 7 shows a diagram representing the relation between etched gap size and lateral gap distances at top and bottom areas of elevated regions, FIG. 9 shows an SEM image of a part of an electrode structure according to an embodiment with additional assistant features.

DETAILED DESCRIPTION OF THE INVENTION

Figure 1A:
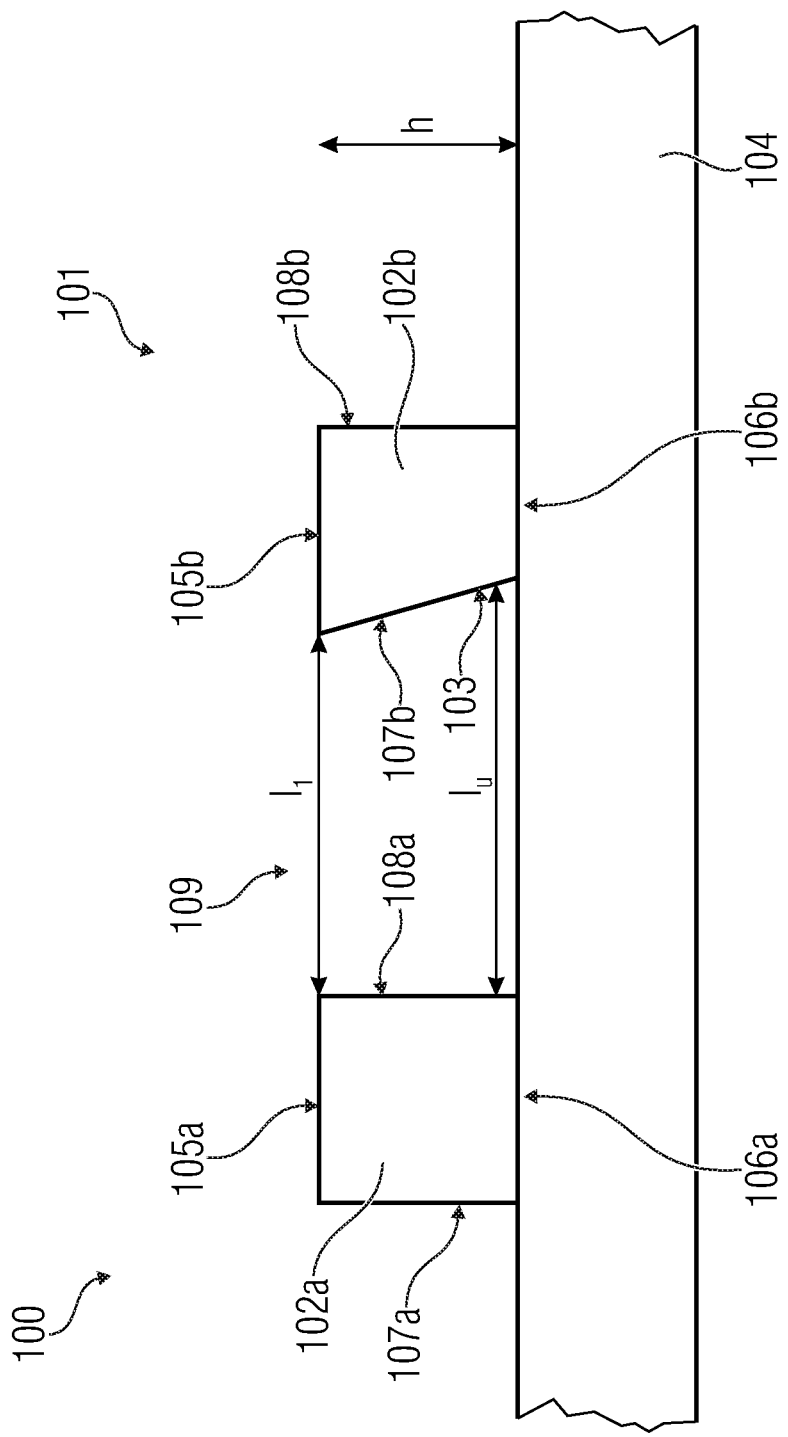
FIG. 1A shows a partial side view of an initial structure according to an embodiment of the invention.

Equal or equivalent elements or elements with equal or equivalent functionality are denoted in the following description by equal or equivalent reference numerals.

Initially, a conventional-technology electrode fabricating step including a lift-off process shall be described with respect to FIGS. 13A to 13E.

Figure 13A:
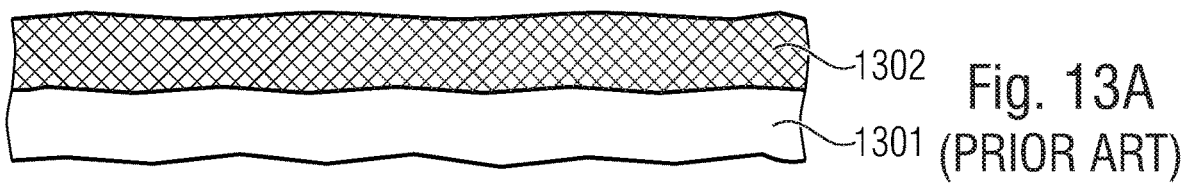
FIGS. 13A to 13E show a conventional lift-off process of conventional technology.

FIG. 13A shows a substrate 1301 and a sacrificial layer 1302 deposited on top of the substrate 1301. The sacrificial layer 1302 may be a photoresist that can be structured as desired by applying a respective mask.

Figure 13B:
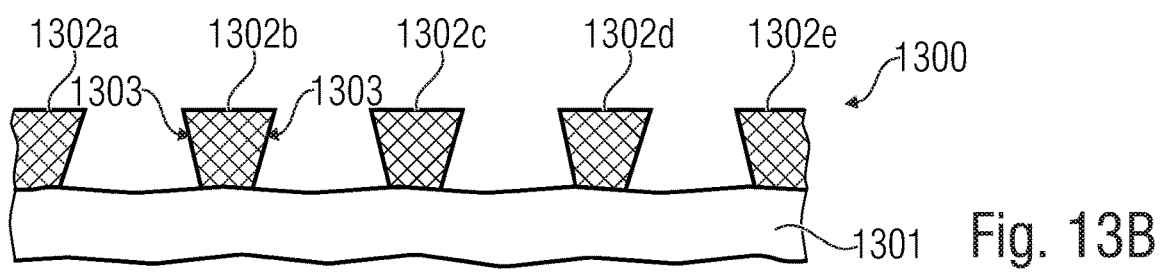

FIG. 13B shows the structured sacrificial layer 1302 after a photolithography step. Accordingly, an initial structure 1300 has been provided which comprises cone-shaped protrusions 1302*a*, 1302*b*, 1302*c*, 1302*d*, 1302*e*. Each of the protrusions comprises a chamfered or sloped portion 1303 at its lateral sides.

Figure 13C:
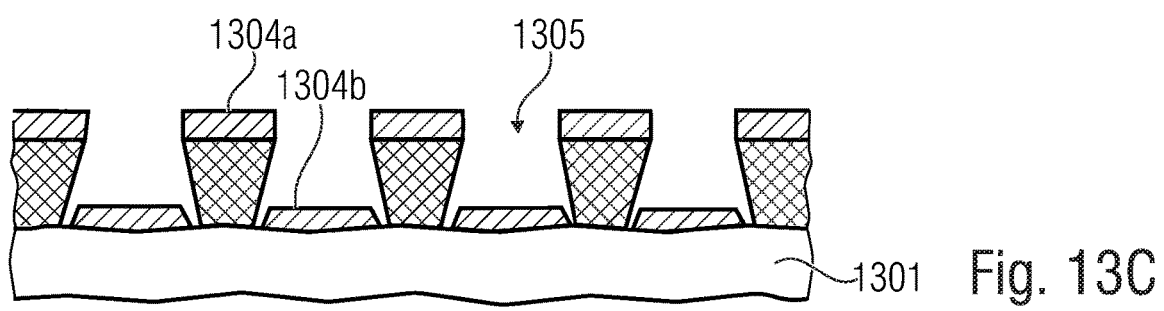

FIG. 13C shows a next process step in which target material, i.e. a conductive electrode material 1304*a* has been applied onto the initial structure 1302. Furthermore, between adjacent protrusions 1302*a* to 1302*e*, a gap 1305 is formed through which target material 1304*b* penetrates and aggregates on the substrate 1301. Only this target material 1304*b* is desired as it provides the final electrode structure, as shown in FIG. 13E. The target material 1304*a* on top of the protrusions 1302*a* to 1302*d* is instead not desired and will therefore have to be removed.

Figure 13D:
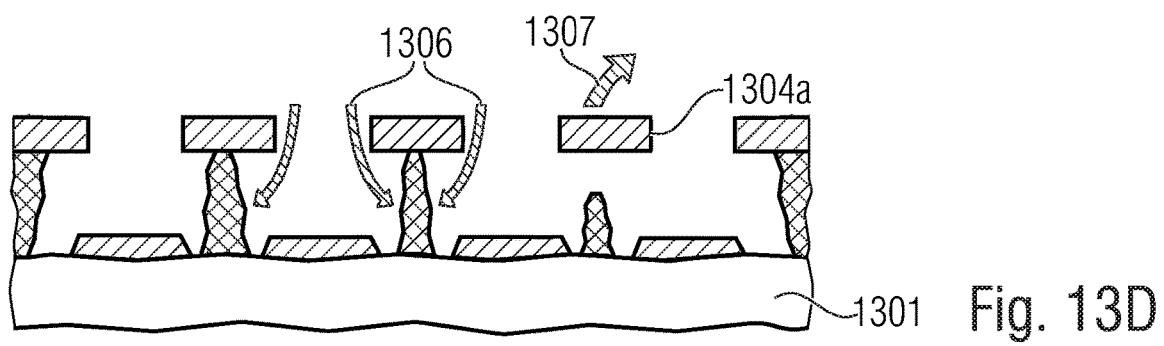
Figure 13E:
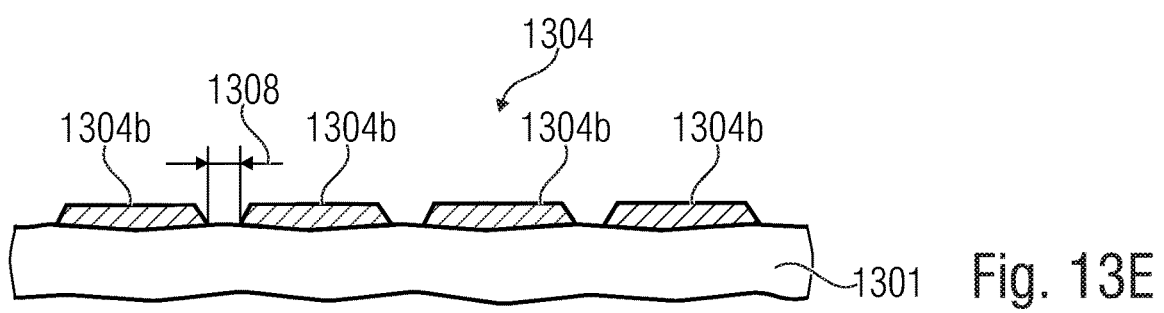

FIG. 13D shows a next process step in which the protrusions 1302a to 1302d and the undesired target material 1304a, that is arranged thereupon, are removed. The protrusions 1302a to 1302d and the target material 1304a may, for instance, be removed by a conventional etching process, as indicated by reference numeral 1306. The chemical used for etching dissolves the protrusions 1302a to 1302d and the remaining target material 1304a is detached, as indicated by the arrow 1307.

FIG. 13E shows the last process step in which the desired parts 1304b of the target material remain and form the desired final electrode structure 1304 on the substrate 1301.

The above described conventional lift-off process may provide an easy and efficient way of producing electrode structures 1304 wherein each electrode 1304b may comprise a lateral width in a micrometer range. Also, the gaps 1308 between adjacent electrodes 1304b may comprise a lateral width in the micrometer range. However, certain defects may more or less regularly occur during the lift-off process. For example, during the etching step as shown in FIG. 13D, detached target material 1304a may deposit on the substrate 1301 and/or on the electrodes 1304b. Other defects, such as burrs due to remaining target material and/or remaining connections between undesired parts 1304a and desired parts 1304b of the target material may occur. Remaining parts of target material may lead to contamination and to formation of unevenness of the otherwise even surface of the electrode structure. It may further cause the problem of short circuitry due to undesired connections between remaining electrode material.

The method according to the present invention proposes a solution to these problems. FIG. 1A shows a step of the inventive method of manufacturing an electrode structure 100, wherein at least a part of the electrode structure 100 is depicted in a side view. First, an initial structure 101 is provided. The initial structure 101 comprises at least two elevated regions 102a, 102b. The elevated regions 102a, 102b extend or protrude from a substrate 104.

The elevated regions 102a, 102b each comprise a top portion 105a, 105b, a bottom portion 106a, 106b, and a first and a second side portion 107a, 107b, 108a, 108b or a left side portion 107a, 107b and a right side portion 108a, 108b, respectively. The right side portion 108a of the first elevated region 102a faces the left side portion 107b of the second elevated region 102b. One or both of the opposing surfaces 108a, 107b (here it is exemplarily the left side portion 107b of the second elevated region 102b) may comprise a sloped portion 103.

The adjacent two elevated regions 102a, 102b are separated from each other by a certain lateral distance, i.e. by a lateral distance between the opposing portions 108a, 107b. A lateral distance between the opposing portions 108a, 107b may vary over the height h of the elevated regions 102a, 102b, for instance due to the provision of a sloped portion 103. In other words, the top portions 105a, 105b of the two elevated regions 102a, 102b may be separated by a first lateral distance $I_1$. The bottom portions 106a, 106b of the two elevated regions 102a, 102b may be separated by a lateral distance $I_u$ that may differ from the first lateral distance $I_1$. In the embodiment of FIG. 1A, the lateral distance $I_1$ is smaller than the lateral distance $I_u$. In particular, $I_1$ is the minimum lateral distance between the first and the second elevated regions 102a, 102b.

However, regarding the ratio of the distances $I_1$ to $I_u$, it may also be possible that the lateral distance $I_1$ is equal to the lateral distance $I_u$. It may further be possible that the lateral distance $I_1$ is slightly, e.g. up to about 15%, larger than the lateral distance $I_u$.

A gap 109 is formed between the first and the second elevated regions 102a, 102b. The lateral distance $I_1$ between the top portions 105a, 105b defines an opening of the gap 109. In this case, the minimum lateral distance $I_1$ defines the minimum size of the opening of the gap 109.

Figure 1B:
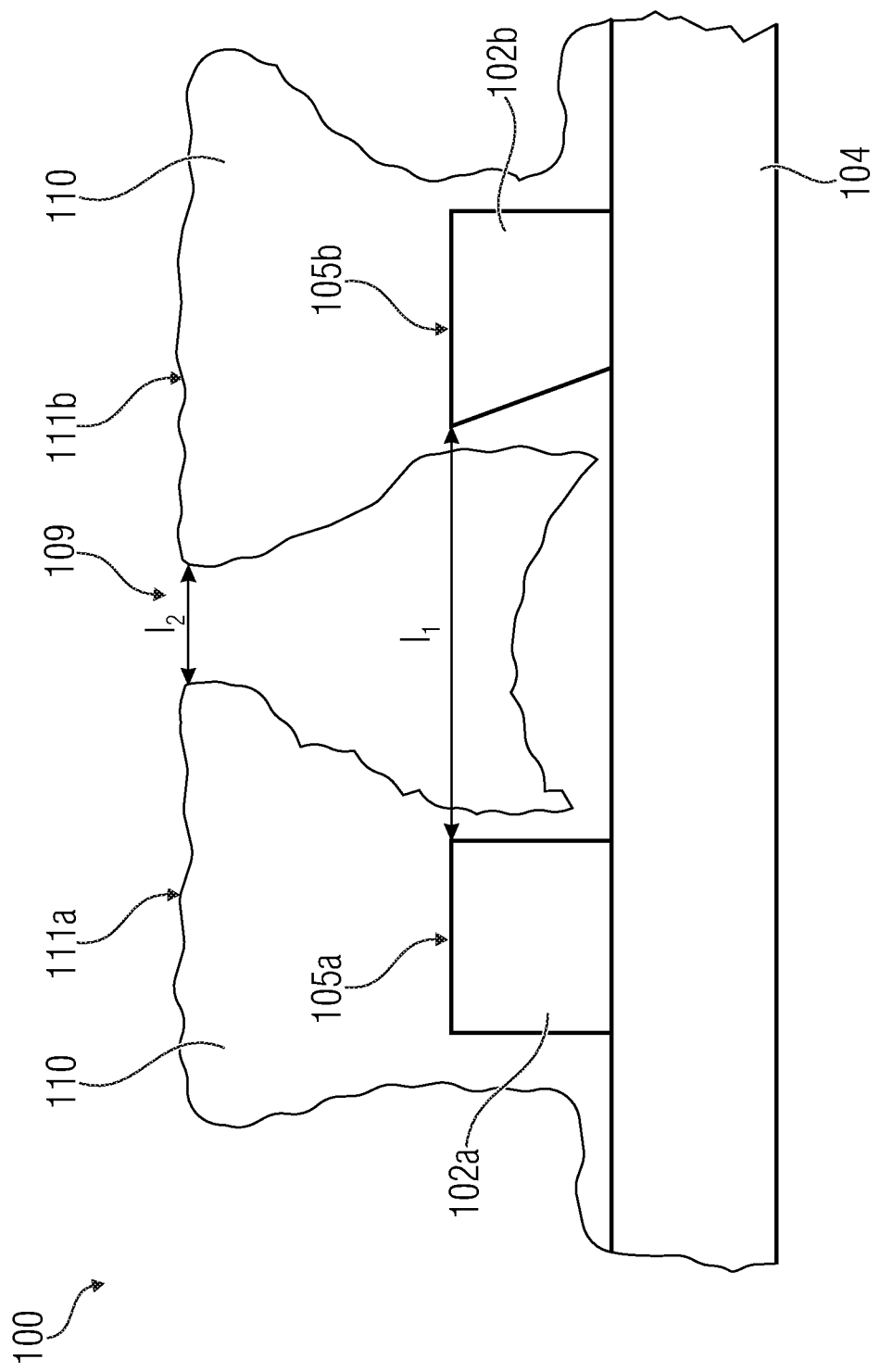
FIG. 1B shows a partial side view of an initial structure after depositing material thereon according to an embodiment of the invention.

FIG. 1B shows a further step of the inventive method of manufacturing an electrode structure 100, wherein at least a part of the electrode structure 100 is depicted in a side view. A material 110 is deposited onto the elevated regions 102a, 102b. As can be seen, portions of the material 110 may also be deposited on the substrate 104, such as beside and between the elevated regions 102a, 102b.

The material 110 that is deposited onto the elevated regions 102a, 102b comprises a top portion. In particular, the portion of the material 110 that is deposited on the first elevated region 102a comprises a first top portion 111a. The portion of the material 110 that is deposited on the second elevated region 102b comprises a second top portion 111b.

The first top portion 111a and the second top portion 111b of the deposited material 110 are separated by a second lateral distance $I_2$. The second lateral distance $I_2$ is smaller than the first lateral distance $I_1$ between the top portions 105a, 105b of the first and second elevated regions 102a, 102b.

A gap 119 is formed between the first and the second top portions 111a, 111b. The lateral distance $I_2$ between the top portions 111a, 111b defines an opening of the gap 119. In this case, the minimum lateral distance $I_2$ defines the minimum size of the opening of the gap 119. The lateral distance $I_2$, i.e. the gap 119, between the top portions 111a, 111b of the deposited material 110 is smaller than the lateral distance $I_1$, i.e. the gap 109, between the top portions 105a, 105b of the elevated regions 102a, 102b. Accordingly, by depositing the material 110 onto the elevated regions 102a, 102b, the opening of the respective gap 109, 119 between these adjacent elevated regions 102a, 102b decreases.

The deposited material 110 is advantageously a dielectric.

Figure 1C:
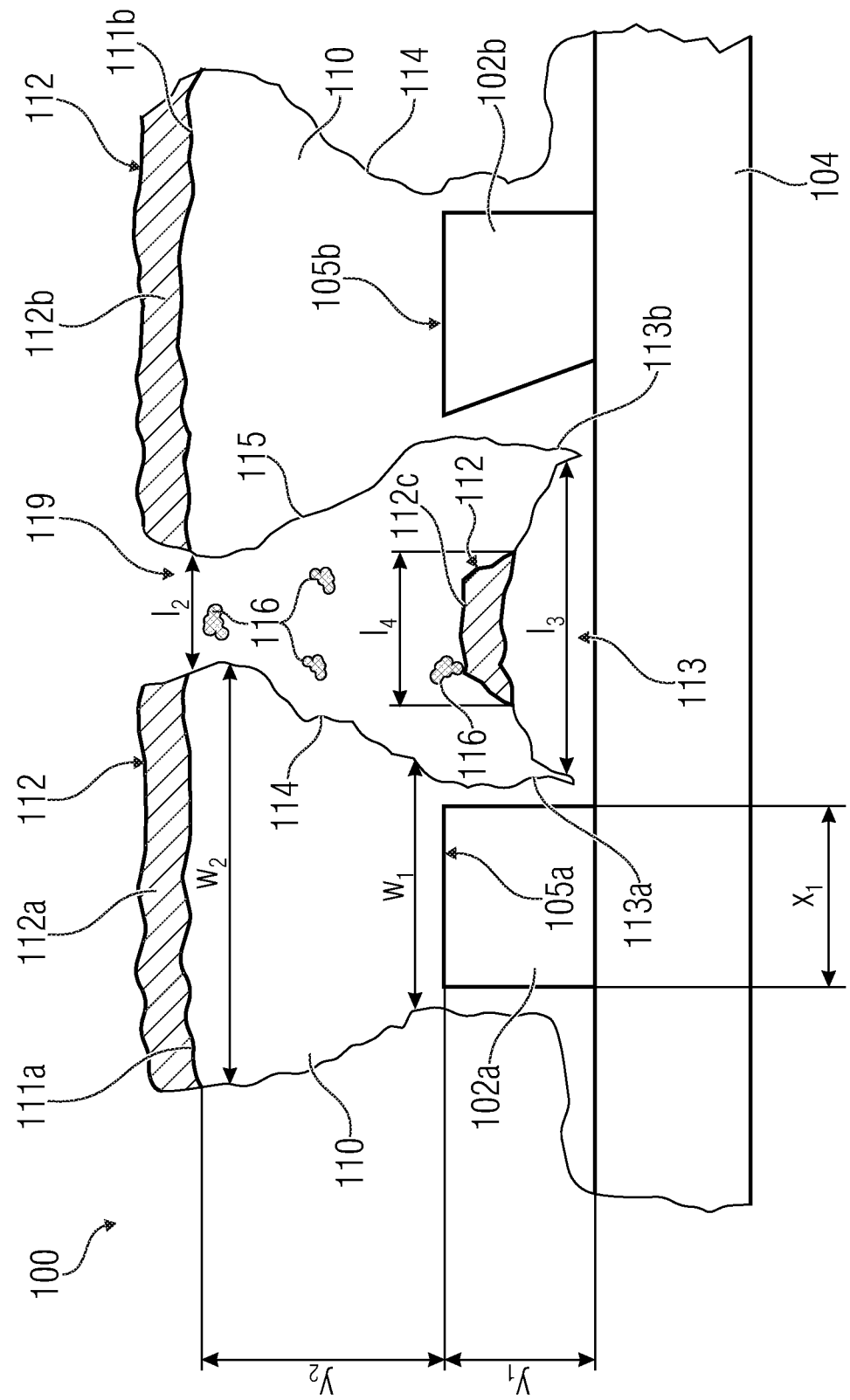
FIG. 1C shows a partial side view of an initial structure after depositing material thereon and after applying electrodes according to an embodiment of the invention.

FIG. 1C shows a further step of the inventive method of manufacturing an electrode structure 100, wherein at least a part of the electrode structure 100 is depicted in a side view. At this step, electrodes 112a, 112b are provided onto the top portions 111a, 111b of the material 110.

More particularly, a first electrode 112a is provided at the top portion 111a of the portion of the material 110 that is deposited onto the first elevated region 102a. A second electrode 112b is provided at the top portion 111b of the portion of the material 110 that is deposited onto the adjacent second elevated region 102b. The electrodes 112a, 112b are advantageously applied onto the respective top portions 111a, 111b by evaporating a conductive material 112, such as gold for instance.

During the evaporation process, some parts 116 of conductive material 112 will penetrate through the gap 119. However, due to the small lateral distance $I_2$ between the top portions 111a, 111b of the deposited material 110, only a small amount 112c of conductive material 112 will aggregate on a bottom portion 113 of the deposited material 110.

As can be seen, the conductive material 112, and particularly the electrodes 112a, 112b, 112c, do not come into contact with each other. This is due to the fact that the cone shape of the material 110 that is deposited onto the elevated regions 102a, 102b provides a shadowing effect which prevents that the electrode material 112 may cover the chamfered or sloped side walls 114, 115. Said shadowing effect will be described in more detail below with respect to FIG. 1D.

Furthermore, if the deposited material 110 is a dielectric, the electrodes 112a, 112b, 112c have no common connected conductive area. Thus, they are physically and electrically insulated from each other.

In an embodiment, the step of depositing the material onto the elevated regions 102a, 102b comprises sputtering the material onto the elevated regions 102a, 102b. For the following discussion of the several embodiments as depicted in the Figures, it is assumed that material has been deposited by sputtering, even though other processes of applying or depositing material onto the elevated regions 102a, 102b may be possible. For example, the material may be deposited onto the elevated regions 102a, 102b by means of physical vapor deposition (VPD). The above mentioned sputtering process, for example, belongs to said physical vapor deposition, i.e. sputtering is one kind of a physical vapor deposition process.

The material 110 sputtered onto an elevated region 102a, 102b comprises a first lateral width $W_1$ adjacent to the top portion 105a, 105b of the elevated region 102a, 102b and a second lateral width $W_2$ remote from the top portion 105a, 105b of the elevated region 102a, 102b. The first lateral width $W_1$ is smaller than the second lateral width $W_2$.

Though these widths $W_1$, $W_2$ are only exemplarily shown in FIG. 1C with respect to the sputtered material portion 110 that is provided at the first elevated region 102a, the same width ratio applies to the material 110 that is sputtered onto the second elevated region 102b and onto any remaining elevated regions which are not shown here. However, an exemption may occur at the outermost elevated regions, as will be described later with reference to FIG. 9 below.

As the width $W_1$ is smaller than the width $W_2$, the material 110 that is sputtered onto the elevated region 102a comprises a cone shape with chamfered or tapered side walls 114, 115. In other words, the material 110 may comprise the shape of a truncated reverse cone.

The elevated regions 102a, 102b are permanently maintained at the initial structure 101. As mentioned above with reference to FIGS. 13A to 13E, a conventional electrode manufacturing method may comprise a lift-off process step in which the elevated structures or protrusions 1302a to 1302e are removed or dissolved after an electrode material 1304a, 1304b has been applied.

Contrary thereto, the method of the present invention does not comprise such a method step of removing the elevated regions 102a, 102b. Instead, the elevated regions 102a, 102b are permanently maintained on the initial structure 101. Thus, any problems that may be associated with conventional lift-off processes may be advantageously avoided by the method according to the present invention.

Still with reference to FIG. 1C, the elevated regions 102a, 102b comprise an aspect ratio of width to height of about 1:1. That is, the lateral width $X_1$ of the elevated region 102a substantially corresponds to the height $Y_1$ of the elevated region 102a. This aspect ratio of 1:1 leads to the effect that the sputtered material 110 is deposited on the top portion 105a of the elevated region 102a in such a way that the material 110 comprises a narrow but high cone shape, as shown in FIG. 1C. An aspect ratio of width to height of about 2:1 and even about 3:1 would still be sufficient to provide the desired cone shape, i.e. to provide an undercut in order to physically and electrically insulate the electrodes from each other.

Furthermore, the lateral width $W_1$ of the material 110 may equal or may be smaller than the height $Y_2$ of the material 110. This may also lead to a narrow but high cone shape.

This particular cone shape arises because the atoms of the sputtered material 110 aggregate during sputtering such that both the height Y and the lateral width W of the material 110 increases during sputtering. However, due to the limited space in the lateral direction, which is dictated by the lateral width $X_1$ of the top portion 105a of the elevated region 102a, the atoms of the material 110 aggregate to a great extent into the height direction Y. Accordingly, the material 110 grows upwardly, i.e. in a height direction Y, such that a narrow and high cone is formed. The material 110 may grow such that the lateral width $W_2$ of the upper cone portion is substantially the same as the height $Y_2$ of the entire cone.

Furthermore, the height $Y_2$ of the material 110 that has been sputtered onto the elevated regions 102a, 102b defines the thickness of the material 110. A thickness of the deposited material 110 between about 400 nm and 700 nm may be particularly advantageous for an initial structure 101 comprising top portions 105a, 105b with a lateral width $X_1$ of about 1 µm and a lateral distance $I_1$ between adjacent top portions 105a, 105 of about 1 µm, according to some embodiments. If the lateral distance $I_1$ is smaller than 1 µm, it may be possible to deposit material 110 onto the elevated regions 102a, 102b, said material 110 having a thickness of between about 400 nm and 100 nm or even less than 100 nm.

As mentioned above, the cone shape of the deposited material 110 forms an undercut that provides a shadowing effect. The undercut helps to avoid an unwanted coverage of adjacent side walls 114, 115 of the deposited material 110 with electrode material. If the side walls 114, 115 were covered with electrode material 112, this may cause a short circuit if such unwanted electrode material 112 comes into contact with each other.

The shadowing effect shall be described in more detail with reference to FIGS. 1B, 1C and 1D. The shadowing effect may be comparable to the effect of the constricted area of an hour glass. As can be seen, the two adjacent cones of material 110 also comprise the shape of an hour glass.

The lateral distance $I_2$ between adjacent top portions 111a, 111b of the deposited material 110 is smaller than a lateral distance $I_3$ between adjacent bottom portions 113a, 113b of the deposited material 110. In other words, the adjacent top portions 111a, 111b of the deposited material 110 may be separated by a gap 119 having a gap width $I_2$. As the deposited material 110 comprises a cone shape, the gap width between the deposited material 110 increases from $I_2$ to $I_3$ as the lateral width of the cones 110 decreases from $W_2$ to $W_1$, when viewed from top to bottom. Accordingly, the gap 119 is smaller or narrower at top portions 111a, 111b of the deposited material 110 than at bottom portions 113a, 113b of the deposited material 110.

Thus, parts 116 of electrode material 112 may only penetrate into the space between two adjacent elevated regions 102a, 102b through the narrow gap 119 at the top portions 111a, 111b. Accordingly, the parts 116 aggregate underneath the narrow gap 119 and form a pile 112c of aggregated electrode material 112. The lateral width $I_4$ of the pile 112c of aggregated electrode material 112 is determined by the gap width $I_2$ and may substantially correspond to the gap width $I_2$.

Figure 1D:
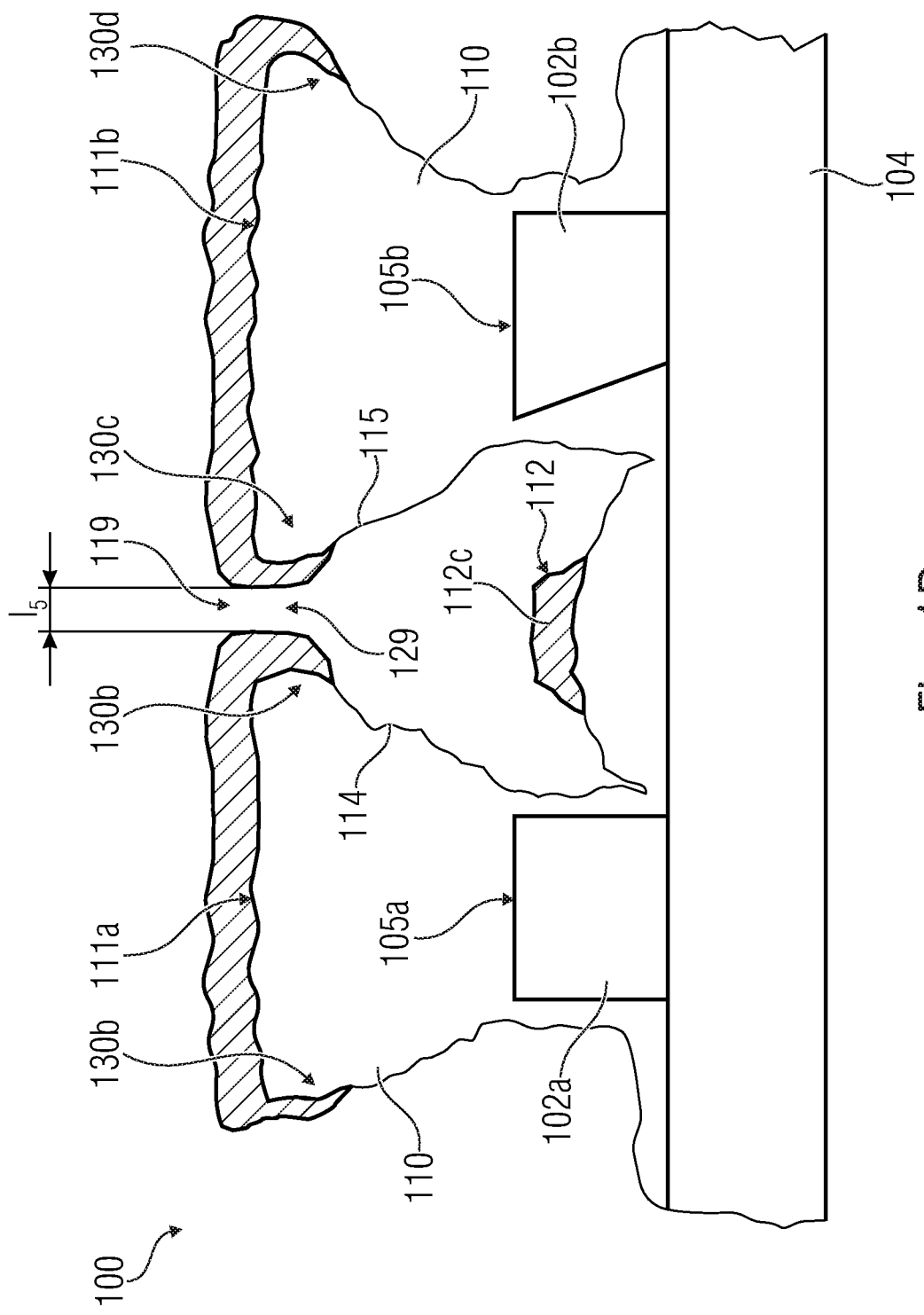
FIG. 1D shows a further partial side view of an initial structure after sputtering material thereon and after applying electrodes according to an embodiment of the invention.

However, as can be seen in FIG. 1D, electrode material 112 may also aggregate, at least partially, along upper lateral portions 130a to 130d of the deposited material 110. In other words, electrode material 112 may at least partially extend into the gap 119. However, as the lateral side walls 114, 115 of the cones are chamfered or tapered inwardly, the electrode material 112 is not able to adhere to these tapered side walls 114, 115 and to entirely cover the sidewalls 114, 115. Thus, the undercut formed by the cone shape of the material 110 helps to avoid that electrode material 112 covers the opposing sidewalls 114, 115 of the cones 110 which may otherwise lead to a short circuit.

Furthermore, the gap 119 between the adjacent top portions 111a, 111b of the deposited material 110 becomes narrower as the electrode material aggregates into a lateral direction. In other words, the lateral distance $I_2$ between the adjacent top portions 111a, 111b of the deposited material 110 decreases as adhering electrode material 112 increases within the gap 119. As a consequence, a narrower gap 129 is formed between electrode material 112 that has aggregated along two adjacent upper lateral portions 130b, 130c. The lateral distance $I_2$ (FIG. 1C) between the top portions 111a, 111b of the deposited material 110 decreases to the smaller lateral distance $I_5$ between the electrode material 112 that has aggregated along the two adjacent upper lateral portions 130b, 130c.

For the following discussion, this gap 129 formed between the electrode material 112 that has aggregated along the two adjacent upper lateral portions 130b, 130c is also referred to as electrode gap 129.

Summarizing, the undercut formed by the cone-shaped deposited material 110 helps to avoid that conductive electrode material 112 covers the side walls 114, 115 of the deposited material 110. Furthermore, the narrow gap width $I_2$ of the gap 119 ensures that only a small amount of parts 116 of conductive material 112 penetrates into the space between adjacent elevated regions 102a, 102b, and that the lateral width $I_4$ of the pile 112c of aggregated electrode material 112 may be determined by the gap width $I_2$ such that the lateral width $I_4$ of the pile 112c of aggregated electrode material 112 is smaller than the lateral width $I_3$ of the lower portions 113a, 113b of the deposited material 110.

Figure 2A:
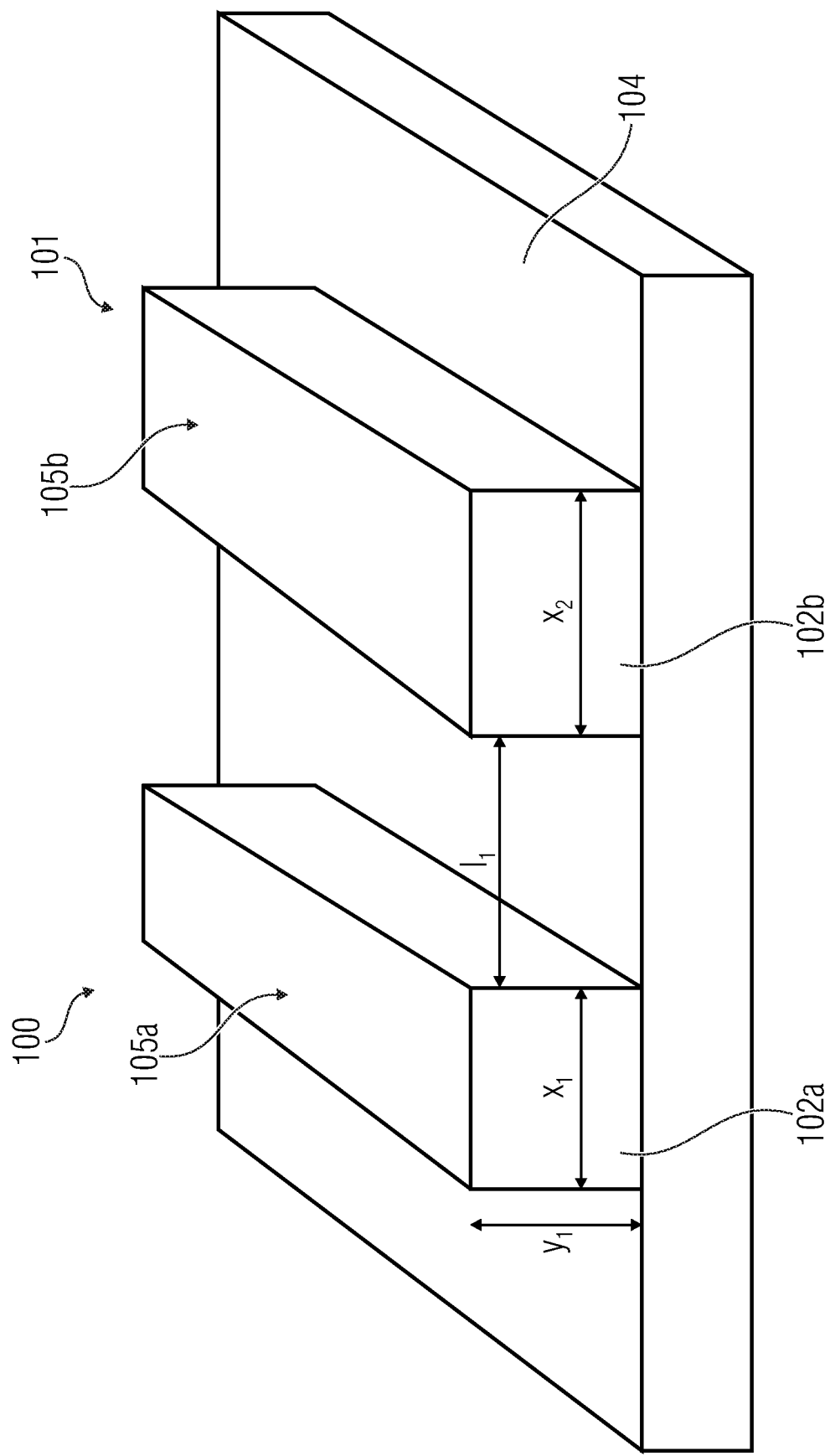
FIG. 2A shows a perspective view of an initial structure according to an embodiment of the invention.
Figure 2B:
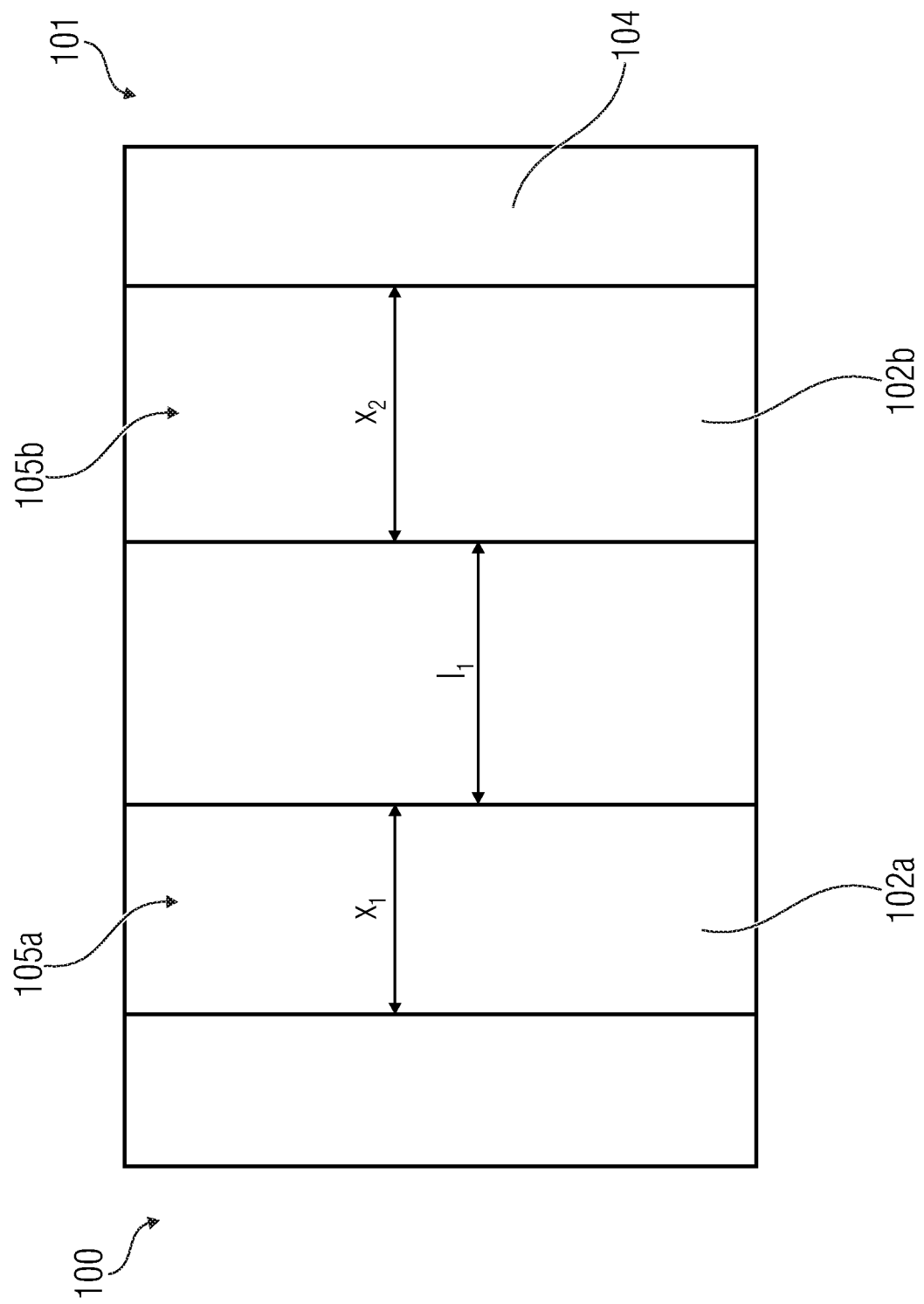
FIG. 2B shows a top view of the initial structure of FIG. 2A.

FIG. 2A shows a perspective side view and FIG. 2B shows a top view of a part of an electrode structure 100. The electrode structure 100 comprises an initial structure 101 comprising a first elevated region 102a and a second elevated region 102b. The first elevated region 102a comprises a first top portion 105a. The second elevated region 102b comprises a second top portion 105b.

Each of the top portions 105a, 105b of the elevated regions 102a, 102b comprises a lateral width $X_1$, $X_2$ that may be about 1 µm in an embodiment. Each of the elevated regions 102a, 102b comprise a height $Y_1$ that may be about 1 µm in an embodiment. The first lateral distance $I_1$ between the adjacent top portions 105a, 105b of the elevated regions 102a, 102b may also be about 1 µm in an embodiment.

FIG. 3A shows a top view of an embodiment of an electrode structure 100 according to the present invention before a material has been deposited, for example by sputtering, onto the elevated regions 102a, 102b. The electrode structure 100 comprises an initial structure 101. The initial structure 101 comprises a plurality of elevated regions 102a, 102b extending from a substrate 104.

A first electrode initial structure 200a comprises a plurality of elevated regions 102a. A second electrode initial structure 200b comprises a plurality of elevated regions 102b.

Each of the first elevated regions 102a comprises a lateral width $X_1$. Each of the second elevated regions 102b comprises a lateral width $X_2$. Between two adjacent elevated regions 102a, 102b, a gap 109 is provided, the gap 109 comprising a lateral width $I_1$. As mentioned above, each of the lateral widths $X_1$, $X_2$ of the elevated regions 102a, 102b and the lateral width $I_1$ of the gap 109 may have the same dimension, for example 1 µm.

The elevated regions 102a, 102b are arranged in an interdigitated manner, i.e. the arrangement of FIG. 3A shows an interdigitated electrode array. That is, the elevated regions 102a of the first electrode initial structure 200a form fingers that alternatingly interdigitate with the elevated regions 102b or fingers of the second electrode initial structure 200b.

Figure 3B:
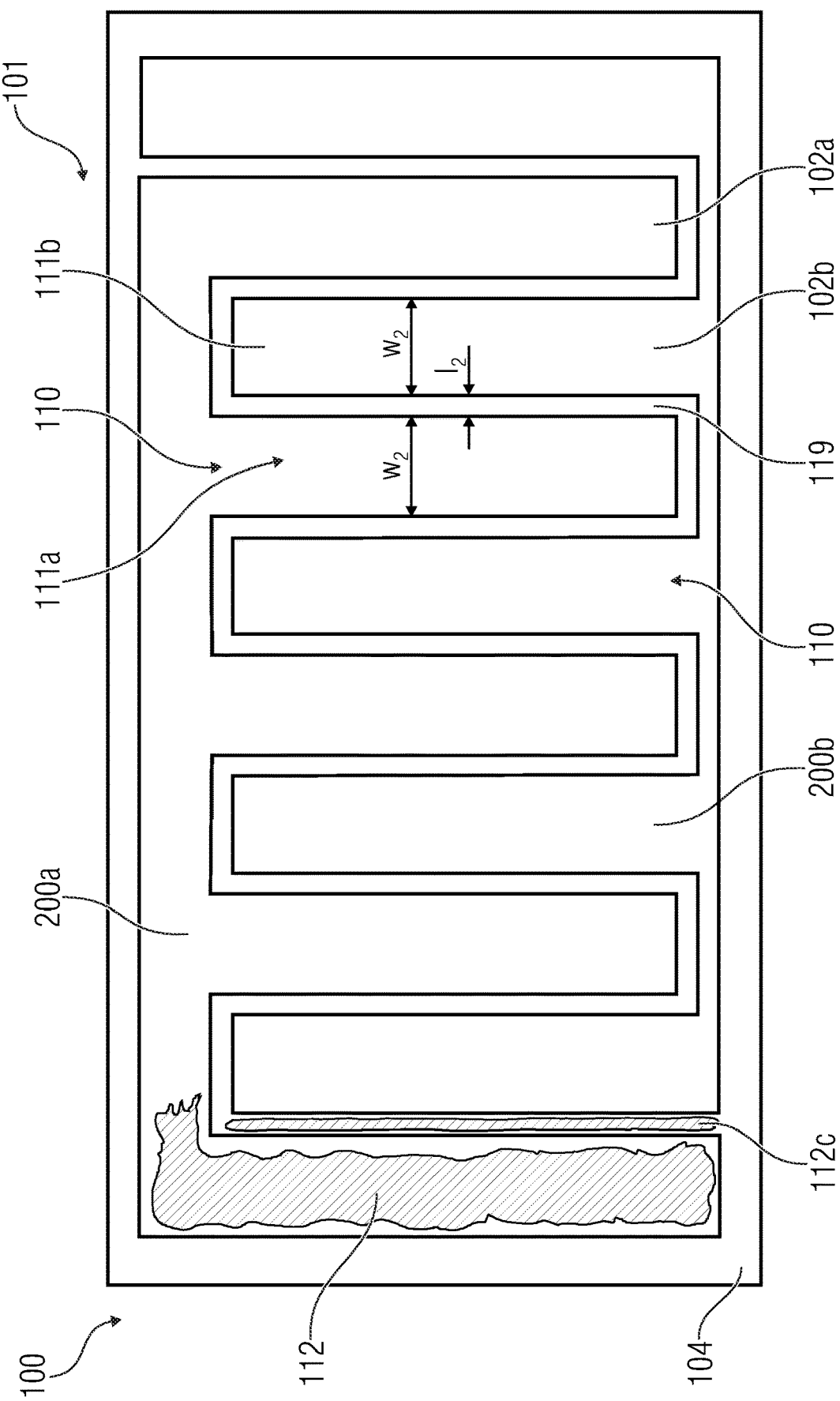
FIG. 3B shows a top view of an initial electrode structure after applying electrode material thereon according to an embodiment of the invention.

FIG. 3B shows a top view of an embodiment of an electrode structure 100 according to the present invention after a material has been deposited onto the elevated regions 102a, 102b. As material 110 has been deposited onto the elevated regions 102a, 102b, only the top portions 111a, 111b of the covering deposited material 110 are visible in the top view of FIG. 3B. The elevated regions 102a, 102b are covered by the deposited material 110 and are therefore not visible in the top view of FIG. 3B.

Thus, the dimensions of the lateral widths that are visible in the top view of FIG. 3B have altered compared to the previous state shown in FIG. 3A. In particular, the top portions 111a, 111b of the deposited material 110 comprise a lateral width $W_2$, as previously described with reference to FIG. 1C. The top portions 111a, 111b are separated by a lateral distance $I_2$. In other words, a gap 119 is formed between the top portions 111a, 111b wherein the gap 119 comprises a lateral distance $I_2$.

When comparing the top view of FIG. 3B with the top view of FIG. 3A, it can be seen that the lateral width $W_2$ of each of the plurality of fingers, i.e. the lateral width $W_2$ of each of the top portions 111a of the material 110 deposited onto the first electrode initial structure 200a, is increased compared to the lateral width $X_1$ of each of the plurality of elevated regions 102a of the first electrode initial structure 200a. The same applies to the second electrode initial structure 200b. The lateral width $W_2$ of each of the plurality of fingers, i.e. the lateral width $W_2$ of each of the top portions 111b of the material 110 deposited onto the second electrode initial structure 200b, is increased compared to the lateral width $X_2$ of each of the plurality of elevated regions 102b of the second electrode initial structure 200b.

The lateral distance $I_2$ between the visible fingers 111a, 111b is decreased compared to the lateral distance $I_1$ between the visible fingers 102a, 102b shown in FIG. 3A. This is the result of the deposition step according to the present invention.

Still with reference to FIG. 3B, it can be seen that in a further step, electrode material 112 may be applied onto the fingers, i.e. onto the top portions 111a, 111b of the deposited material 110, as exemplarily shown at the left finger portion in FIG. 3B. Furthermore, as previously described with reference to FIG. 1C, parts 116 of electrode material 112 may penetrate through the gap 119 into the free space between adjacent elevated regions 102a, 102b. As a consequence, these parts 116 accumulate underneath the gap 119 and form an accumulated pile 112c of electrode material, as is also exemplarily shown at the left finger portion in FIG. 3B. However, due to the undercut and the shadowing effect of the cone shape of the deposited material 110, the space between the adjacent elevated regions 102a, 102b is not entirely filled with electrode material 112. Accordingly, the pile 112c of electrode material 112 is not connected to electrode material 112 on top of the deposited material 110. Thus, a short circuit is prevented.

The inventive deposition step allows a precise adjustment of the width of the electrode gap 129. The inventive method allows to provide electrode gaps 129 in the range of nanometers, in particular providing electrode gaps 129 of 100 nm or less is possible. While the first lateral distance $I_1$ between the elevated regions 102a, 102b may be in the range of microns or down to nanometers, the lateral distance $I_5$ of the electrode gap 129 may be in the range of nanometers. In some embodiments, the first lateral distance $I_1$ may be between about 3 µm and 1 µm, advantageously between 1 µm and 800 nm, more advantageously between about 800 nm and 500 nm, and still more advantageously between about 500 nm and 100 nm. In some embodiments, the lateral distance $I_5$ of the electrode gap 129 may be less than 100 nm.

Figure 4:
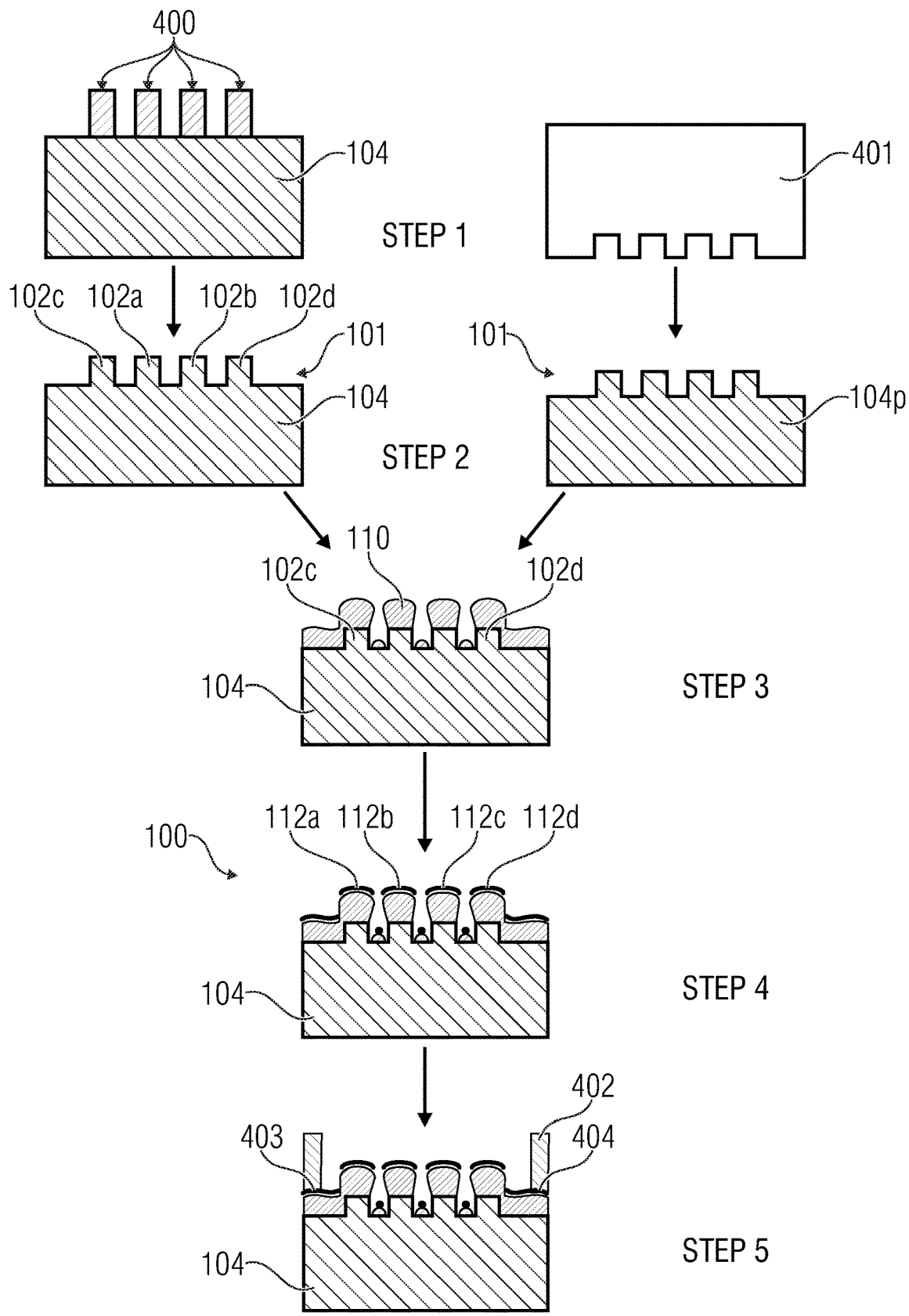
FIG. 4 shows an exemplary process with different process steps according to an embodiment of the invention.

With reference to FIG. 4, an example of an inventive method shall be described in detail.

According to the invention, an electrode structure can be provided on different substrates, like silicon, glass, plastic or any metal. According to the described example, the first step is to define the initial sensor electrode structure 101 by photolithography or any other patterning technique (e-beam, ion beam, injection molding, hot embossing, nano-imprint, inkjet printing, lamination, screen printing . . . ).

For example, as shown at the right hand side of STEP 1 and STEP 2, a plastic substrate 104p may be provided, wherein a stamp 401 comprising a negative profile of the initial structure 101 may imprint the positive initial structure 101 onto the substrate 104p. Aspect ratios of 1:1 (width to height) or higher, for example up to 3:1, are advantageous for a desired undercut.

In the alternative example shown on the left hand side of STEP 1 and STEP 2, silicon is used as a substrate 104 and the initial structure 101 is defined by photolithography. The pattern of the initial structure 101 is etched 1 µm deep into silicon by dry-etching and a photoresist 400 is removed by $O_2$ plasma. It is not necessary to etch the pattern into the substrate 104, also the masking material (for instances photoresist 400) can already be used as an initial structure 101, as will be described later with respect to FIG. 12.

The structured silicon 101 is then prepared for forming the undercut profile during a deposition step, as shown in STEP 3. In an embodiment, the deposition step may comprise sputtering the material 110 onto the elevated regions 102a, 102b. Different materials can be used for defining the undercut during the sputtering process. It is also possible to sputter a metal, which forms the undercut, followed by a dielectric layer, which covers the metal completely.

In this example, a $SiO_2$ layer with a thickness of 400 nm was used as sputtering material 110. Due to the fact that the elevated regions 102a, 102b, 102c, 102d are close to each other (around 1 µm or less) and the substrate 104 is rotating in the sputtering chamber (not mandatory), a shadowing effect is generated which forms the undercut profile during sputtering.

In this example, the material distribution in the sputtering chamber is well defined. For instance a $SiO_2$ layer of 400 nm and a lateral distance $I_1$ of 500 nm between the elevated regions 102a to 102d results in a gap 119 between adjacent elevated regions 102a, 102b of 150 nm before electrode material 112 is applied. In an embodiment, electrode material 112 is applied by evaporation of conductive material.

To maintain an efficient undercut, the elevated regions 102a to 102d have to be close to each other. A sufficient undercut is particularly formed between two nearby structures. Accordingly, the outermost lateral side walls of the outermost elevated regions 102c, 102d may not comprise an undercut.

By a correct choice of the lateral distances and heights of the elevated regions on the initial electrode pattern 101, a separation between the evaporated electrodes 112a to 112d can be achieved, as can be seen in STEP 4. A subsequent evaporation step with the desired metal layer creates these conductive electrodes 112a to 112d.

As shown in STEP 5, a final isolation layer 402, in this example SU-8 3005, defines the measuring areas of a biosensor, i.e. electrode pairs 112a to 112d, reference electrode 403 and counter electrode 404. For example, for an on-chip reference electrode, the wafer is electroplated with silver (Ag) and then a layer of silver chloride (AgCl) is formed. At last step (not shown here), the wafer is diced by a wafer dicer or by a laser.

Silicon is not well suited for biosensors in mass production as substrate material, because the biosensors are mostly disposable products and therefore it is expensive compared to plastic. As mentioned above, the lithography step can be replaced by using, for instance, injection molding (or hot embossing) for producing pre-structured substrates, i.e. initial structures 101 for mass production. The only requirement is to produce the master stamp 401 with the desired (negative) electrode and chip pattern.

Figure 5A:
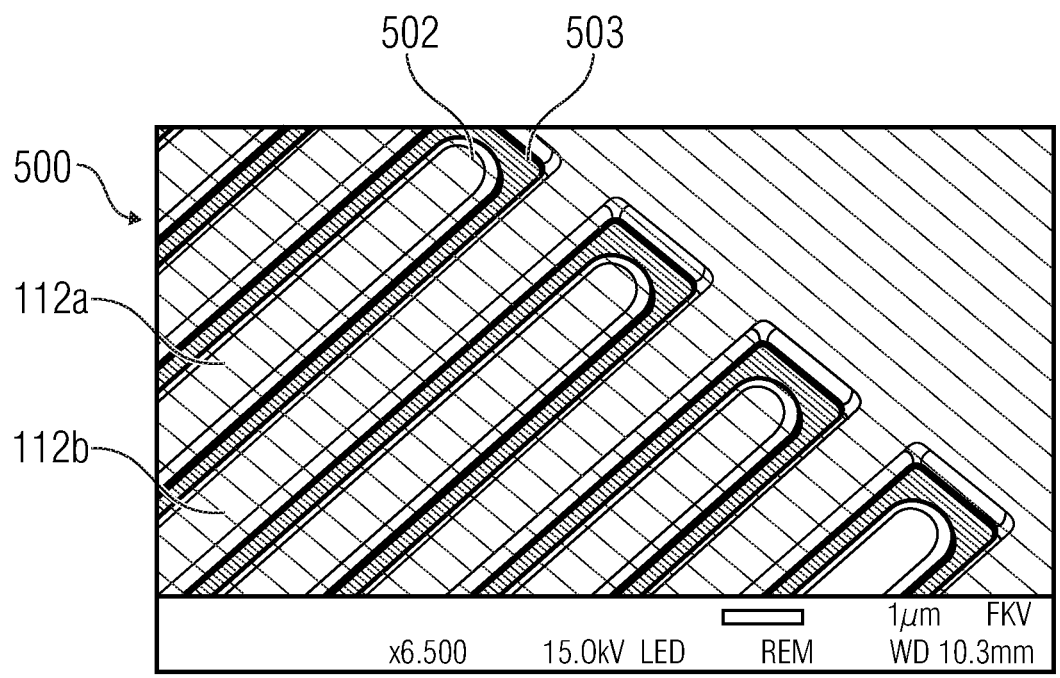
FIG. 5A shows an SEM image of an electrode structure according to an embodiment of the invention.
Figure 5B:
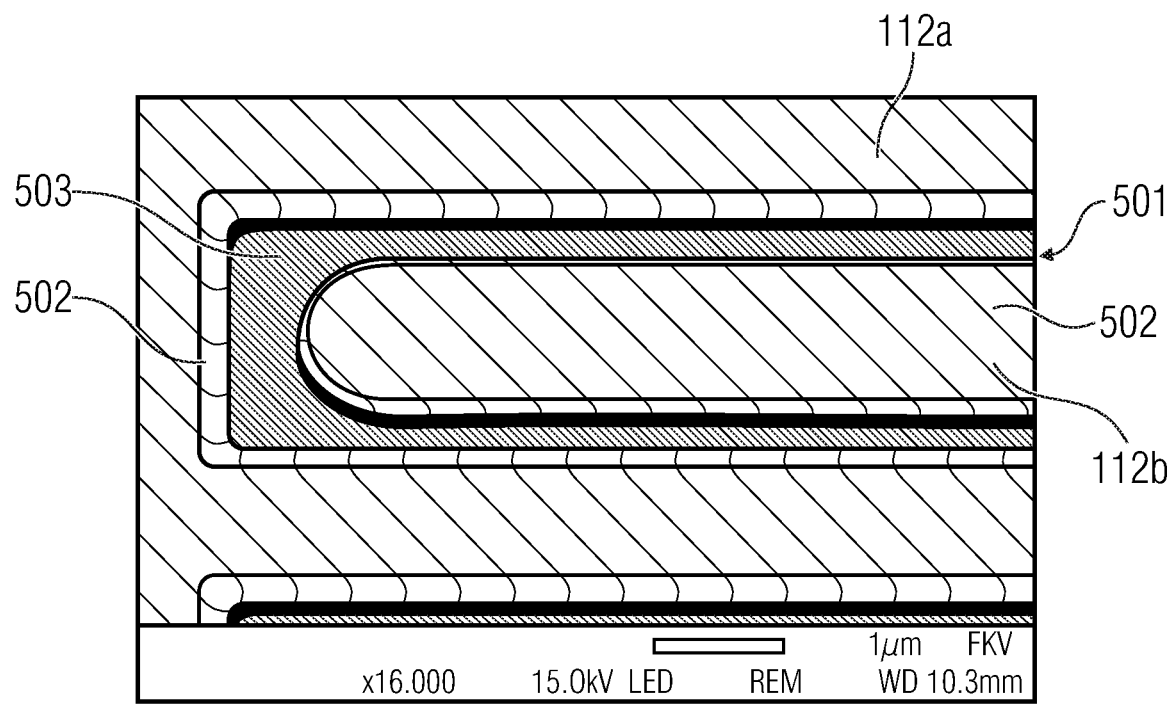
FIG. 5B shows a further SEM image which is a close up of a part of FIG. 5A.
Figure 5C:
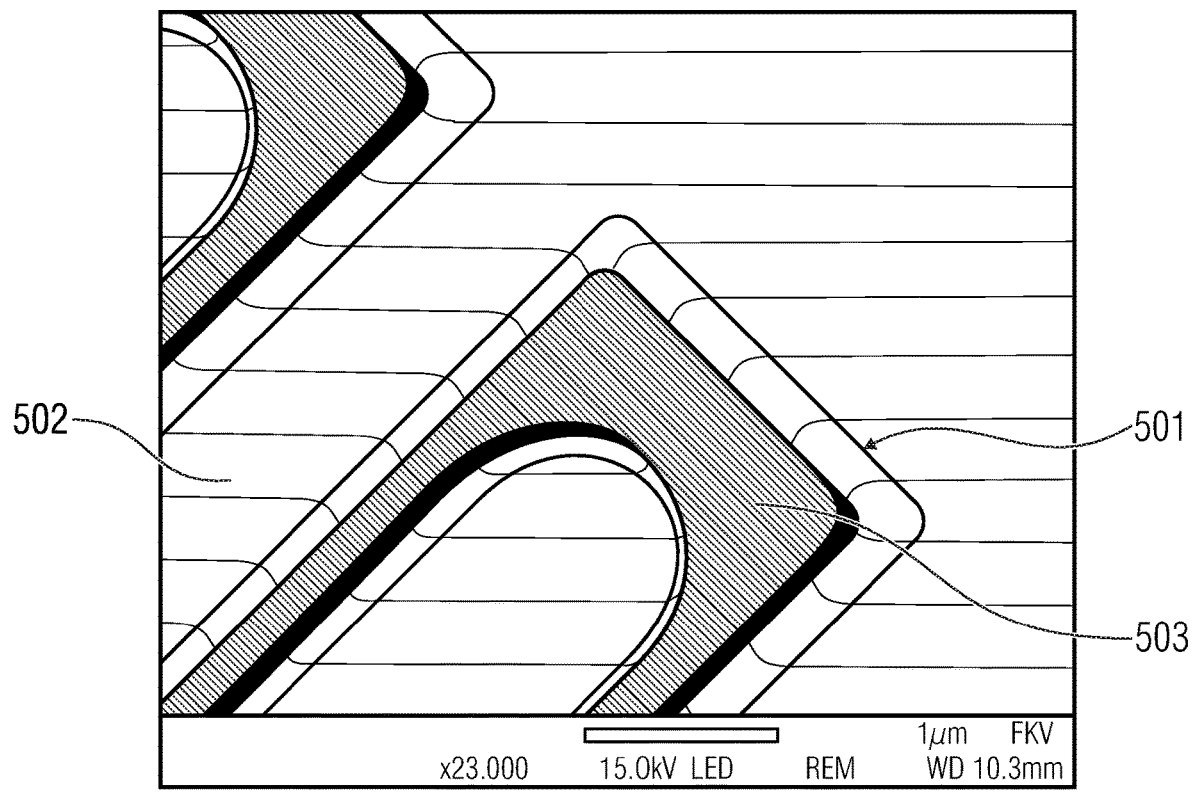
FIG. 5C shows a further SEM image which is a close up of a part of FIG. 5B.

FIGS. 5A, 5B and 5C show SEM pictures showing an undercut profile after evaporation. In other words, the SEM pictures have been taken after the step of applying electrode material 112 onto the deposited material 110. Thus, only the electrode material 112 applied on top is visible in these SEM pictures shown in FIGS. 5A to 5C.

FIG. 5A shows a partial overview of some finger pairs, i.e. of electrodes 112a, 112b, of an interdigitated electrode array 500. The electrode array 500 comprises a first electrode 112a and a second electrode 112b. As the electrode array 500 has been provided as described above, for example by sputtering a material 110 onto elevated regions 102a, 102b, the electrode array 500 comprises an upper structure 502 and a lower structure 503.

FIG. 5B shows a close up of a finger end of the electrode array 500. As can be seen, the dark area 501 between upper structure 502 and lower structure 503 indicates that there is no metal, i.e. no conductive electrode material 112, existent and a successfully separation between the electrodes 112a, 112b is achieved.

FIG. 5C shows a further close up of a finger end from another angle (opposite side than in FIG. 5B). It can be seen that between upper and lower level structures 502, 503 no electrical connectivity is given.

With the inventive method, a biosensor chip was manufactured which is shown in FIGS. 6A to 6C. Said biosensor chip and the method steps for obtaining said biosensor chip shall now be described with respect to FIGS. 6 to 8.

FIG. 6A shows the design of the entire chip with two separate measurement units 601, 602.

FIG. 6B is a close up of the main part of unit 601 with a reference electrode 604 on the left side, a counter electrode 605 on the right to top side and an IDA finger pattern 603 in the middle.

FIG. 6C shows a detail of the IDA finger pattern 603 with assistant features 606a, 606b on the top, wherein the depicted three lines and spaces 606a belong to the counter electrode 605 and the depicted three lines and spaces 606b are provided to separate the finger structures 603 from the surrounding area.

As shown in FIGS. 6A to 6C, the actual die includes two fully functional IDA chips 601, 602. The size of the die is 20×5.5 mm². The large size of the chip 601, 602 allows a good handling and the implementation of microfluidics is comfortable. The initial structure for the finger pattern 603 comprises elevated regions 102a, 102b with a lateral width $X_1$, $X_2$ of about 1 µm. The lateral distance $I_1$, i.e. the width of the gap 109, between adjacent elevated regions 102a, 102b is also about 1 µm.

There are 300 finger pairs with a respective finger length of 149 µm, which results in an effective electrode area of 0,175 mm². Furthermore, for each chip 601, 602 (two on a die), a reference electrode 604 with an area of 0.258 mm² is implemented as well as a counter electrode 605. Assistant features 606a, 606b provide a separation of the electrodes 603, 604, 605.

The dark shaded areas 603, 604, 605, 607, 609 show the openings or gaps after insulation, all other areas are covered with SU-8. At the bottom of the die, contact pads 609 for each chip 601, 602 are visible, i.e. for the reference electrode 604, the two interdigitated finger electrodes 603 and the counter electrode 605.

For the chip fabrication, and in particular for providing an initial structure, silicon was used as a substrate. As a masking layer for the dry etching of silicon the photoresist AZ 701 MiR with a thickness of 760 nm was used. The soft-bake was performed at 90° C. for 60 seconds on hotplate in contact mode. Then the wafer was exposed with 160 mJ/cm² (i-line) at a mask aligner in vacuum contact mode. A post exposure bake of 60 seconds at 110° C. was carried out on a hotplate in contact mode.

For the development, the developer AZ726 MIF was used and 60 seconds are sufficient to dissolve the exposed areas. The wafer was rinsed with DI water and spin-dried. The initial structure comprised elevated regions with a lateral width of about 1 µm and a 1 µm gap between the elevated regions. The gaps were etched 1 µm into silicon by dry etching with gas chopping technique ($SF_6$, $C_4F_8$). The photoresist was then removed by $O_2$ plasma.

A 700 nm $SiO_2$ layer was sputtered (Oerlikeon LLS EVO) onto the initial structure. Due to the effect of shadow masking during the deposition step, an inhomogeneous distribution of the oxide layer was realized.

FIG. 7 shows the relation between dry etch distance to the minimum distance between the elevated regions. It shows a measurement data for a 1 µm deep dry etched structure and the minimum gap width that is formed by depositing 400 nm $SiO_2$.

The dots 701 around the upper line 700 represent the measured distance at the bottom of the initial structure with the largest distance. The dots 702 around the lower line 703 represent the measured distance on the top of the initial structure. The axis of abscissa shows the different lateral distances between adjacent elevated structures. For example, if a lateral distance (etched gap 109 size) of about 500 nm is provided between two elevated regions, a minimum distance (gap 119) of 150 nm can be created that shows a distance of 400 nm on the bottom. Accordingly, an undercut of about 125 nm ((400 nm-150 nm)/2) on each side could thereby be created.

The characteristic formation of an undercut is used to obtain a separation of the top and bottom structures 502, 503 (see FIG. 5) during the subsequent evaporation step in which electrode material is applied onto the previously deposited material. A 100 nm thick layer of gold (Au) was chosen to define the electrodes.

Figure 8A:
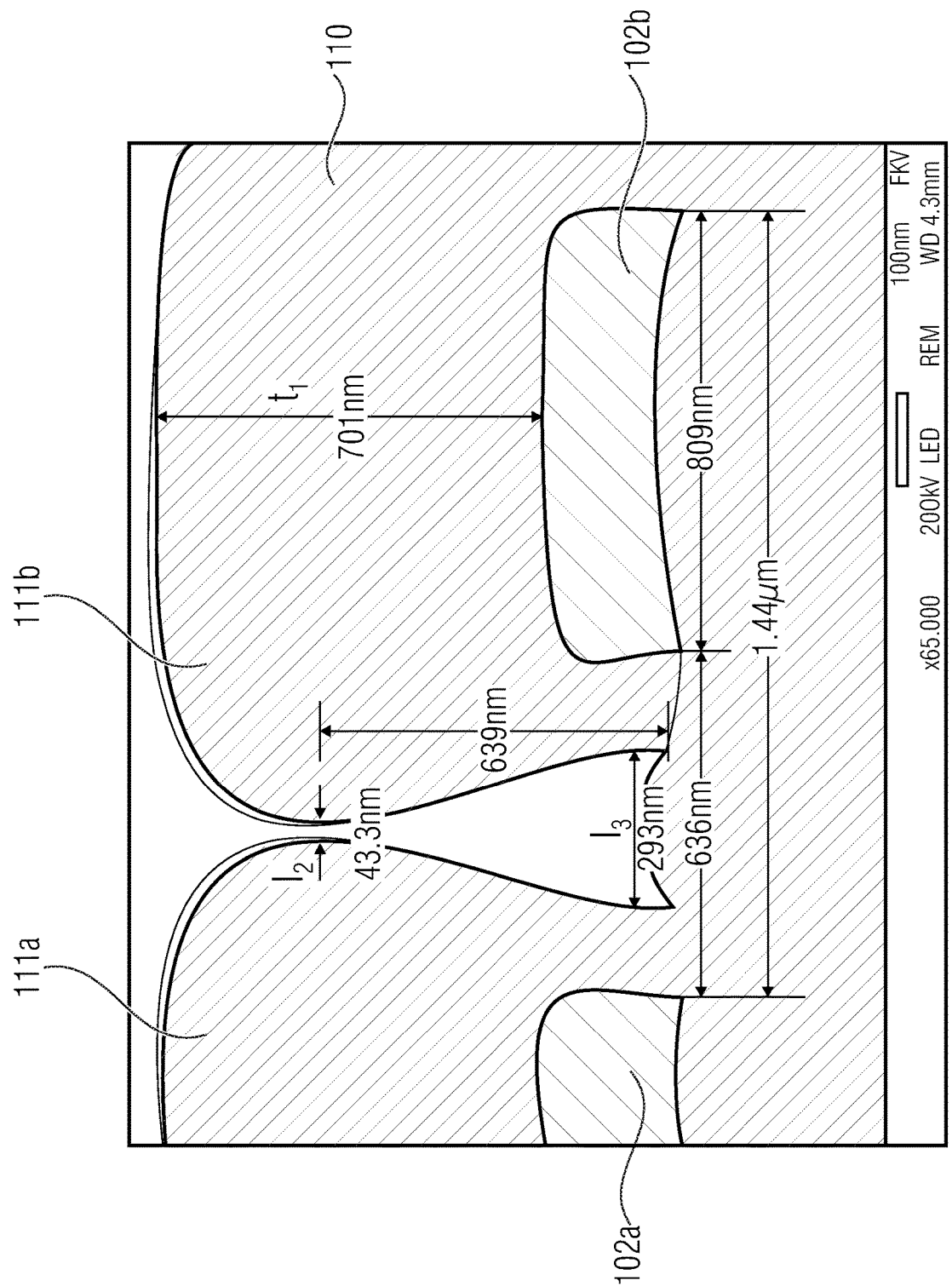
FIG. 8A shows an SEM image of a part of an electrode structure according to an embodiment.
Figure 8B:
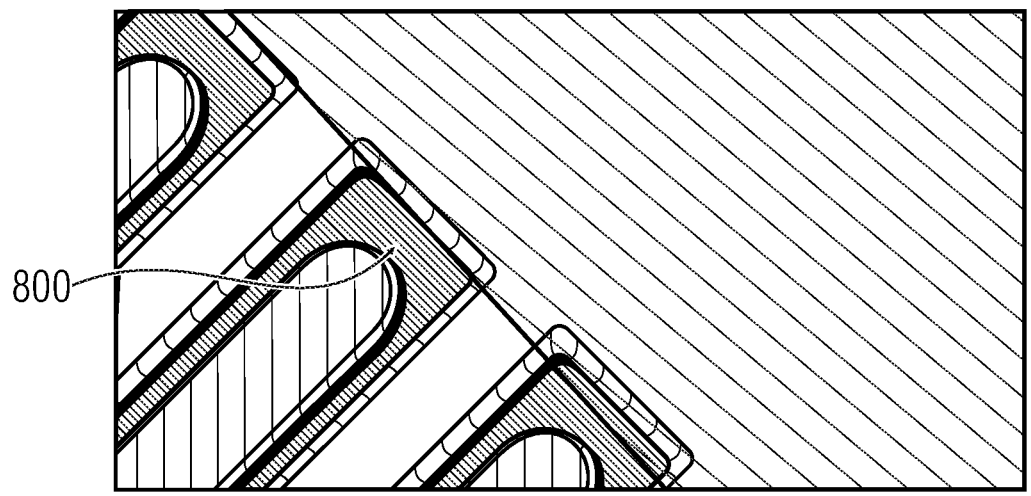
FIG. 8B shows a further SEM image which is a close up of a part of an electrode structure according to an embodiment.
Figure 8C:
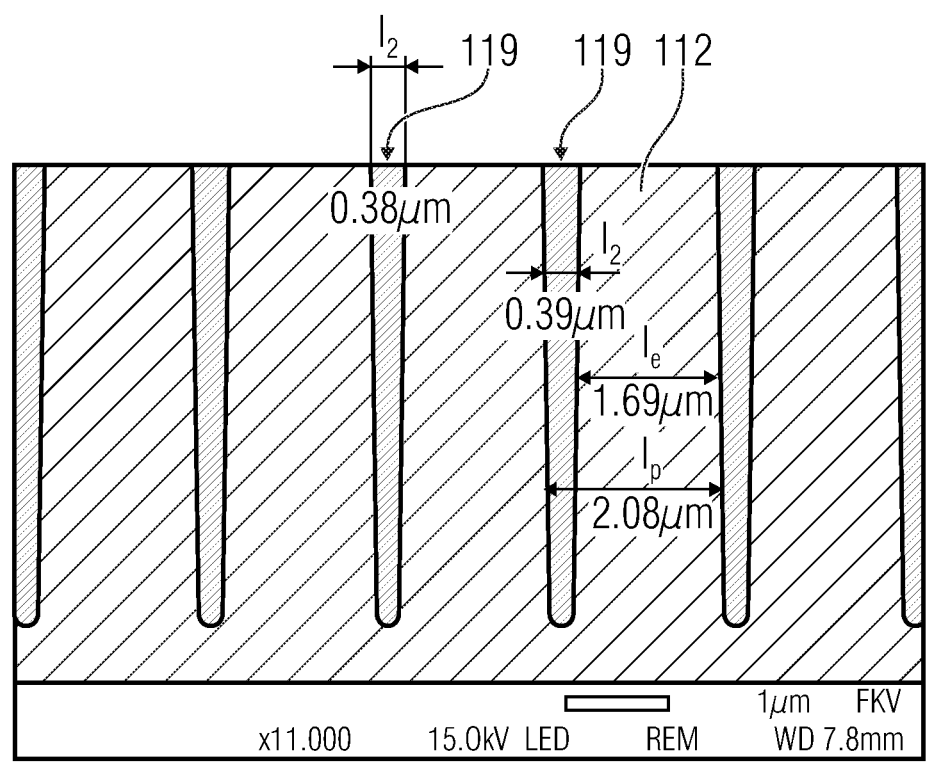
FIG. 8C shows a further SEM image which is a close up of a part of an electrode structure according to an embodiment.

FIGS. 8A to 8C show further SEM pictures of samples that have been prepared with the method according to the present invention, wherein the material has been deposited on the elevated regions by means of sputtering.

FIG. 8A shows a close up view of a 700 nm l/s etched initial structure that has been sputtered with 700 nm $SiO_2$ material 110. That is, the thickness $t_1$ of the sputtered material 110 is about 700 nm. The minimum lateral distance $I_2$ between adjacent top portions 111a, 111b of the sputtered material 110 is about 43 nm. The minimum lateral distance $I_3$ at the bottom 113 is about 300 nm. Accordingly, an undercut has been formed by sputtering the material 110 onto elevated regions 102a, 102b.

FIG. 8B shows an SEM image of a further sample that comprises an undercut 800 that has been formed after sputtering 700 nm $SiO_2$. The initial structure had a lateral distance between adjacent elevated structures of about 750 nm and a period of about 1.6 µm.

FIG. 8C shows an SEM image of a further sample wherein the lateral width of the elevated regions was about 1 µm. This sample has been deposited with 500 nm $SiO_2$. The lateral width $I_e$ of an electrode 112 is about 1.7 µm. A period $I_p$ between adjacent electrodes 112 is about 2 µm. The gaps 119 between adjacent electrodes 112 comprise a lateral distance $I_2$ of about 380 nm.

As mentioned above, an undercut may only be sufficiently formed between two nearby structures. Thus, the outermost surfaces of the outermost finger structures may not be able to provide an undercut.

To overcome this problem with the outermost finger structures not showing any undercut profile, assistant features were added. These assistant features allow a separation of the electrode areas and their bonding pads to each other in order to prevent a short-circuit. These assistant features are shown in FIG. 9.

FIG. 9 shows a part of an interdigitated electrode array 900. The array 900 comprises first and second electrode finger structures 112a, 112b, wherein the first electrode finger structure 112a is an outermost finger structure. In this example, three additional 1 µm lines 901 (1 µm lateral width and separated by 1 µm from each other) were added in the design, surrounding the complete electrode array 900 (one electrode plus the interconnection and the bonding pad). More particularly, the assistant features 901 face the outermost finger structure 112a.

Theoretically, only one assistant feature 901 would be sufficient to separate the electrode array 900 from the surrounding. Nevertheless, to make sure that no short circuit is generated between the outer circumference and the electrode array 900, two additional 1 µm lines were added.

The size of the assistant features 901 depends on the desired deposited material, e.g. the desired dielectric layer. If the thickness of a $SiO_2$ layer is larger than 700 nm, then the distance and feature size of the assistant features 901 should be selected larger than 1 µm but not more than 3 µm (especially the gap between the structures should be larger). The large distance prevents a short circuit of the assistant features 901 because the distance between the assistant features 901 will be less than 50 nm before evaporation step, i.e. after the deposition step. The assistant features 901 should not be too large, otherwise the shadowing effect is not existent and no undercut is formed.

The assistant features 901 also have an additional functionality. The continuation of the periodic finger structure 112a, 112b of the array 900 by means of the assistant features 901 helps to overcome the intensity distribution shift which is generated due to Fresnel diffraction.

To get a better critical dimension (CD) uniformity at the outermost finger structure 112a, the three assistant features 901 help obtaining equal intensity distributions for the complete array 900. A customization of the outermost finger structure 112a on the mask would also be possible, but due to the fact that a gap between the mask and wafer during exposure is more dominant, the better choice is to create same conditions for all finger structures.

Figure 10A:
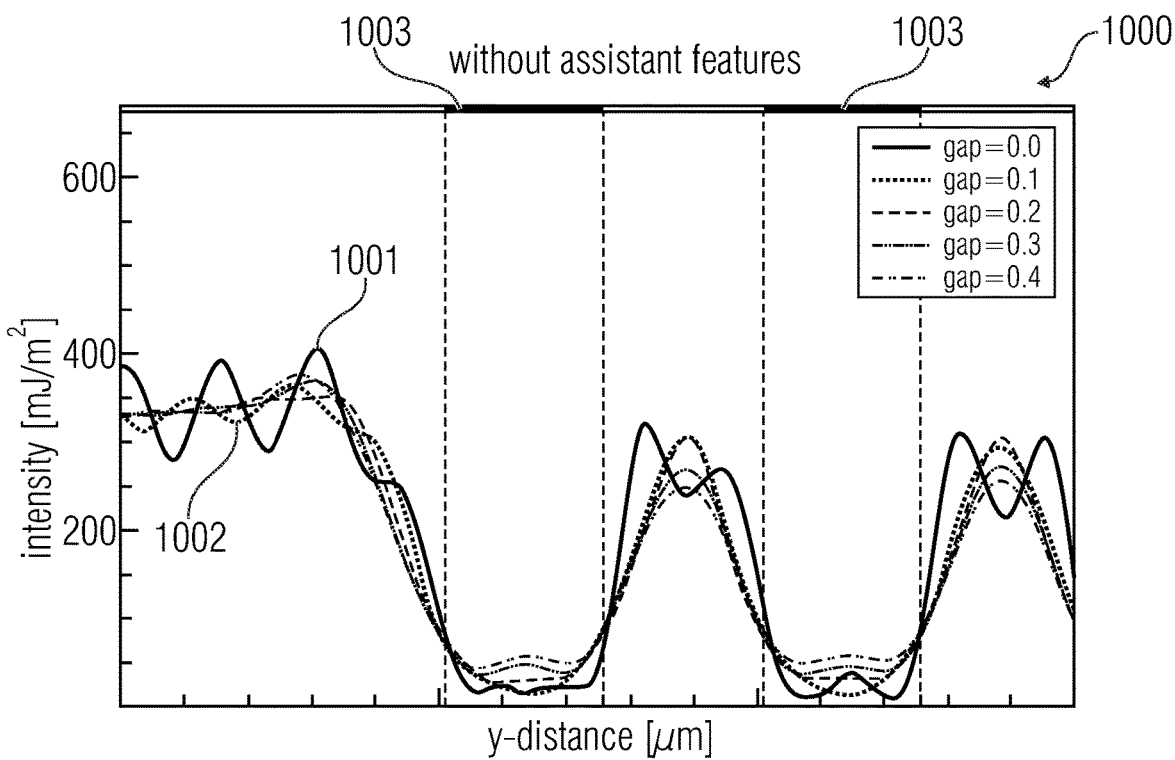
FIG. 10A shows a diagram representing the intensity distribution versus y-distance during lithography without assistant features.
Figure 10B:
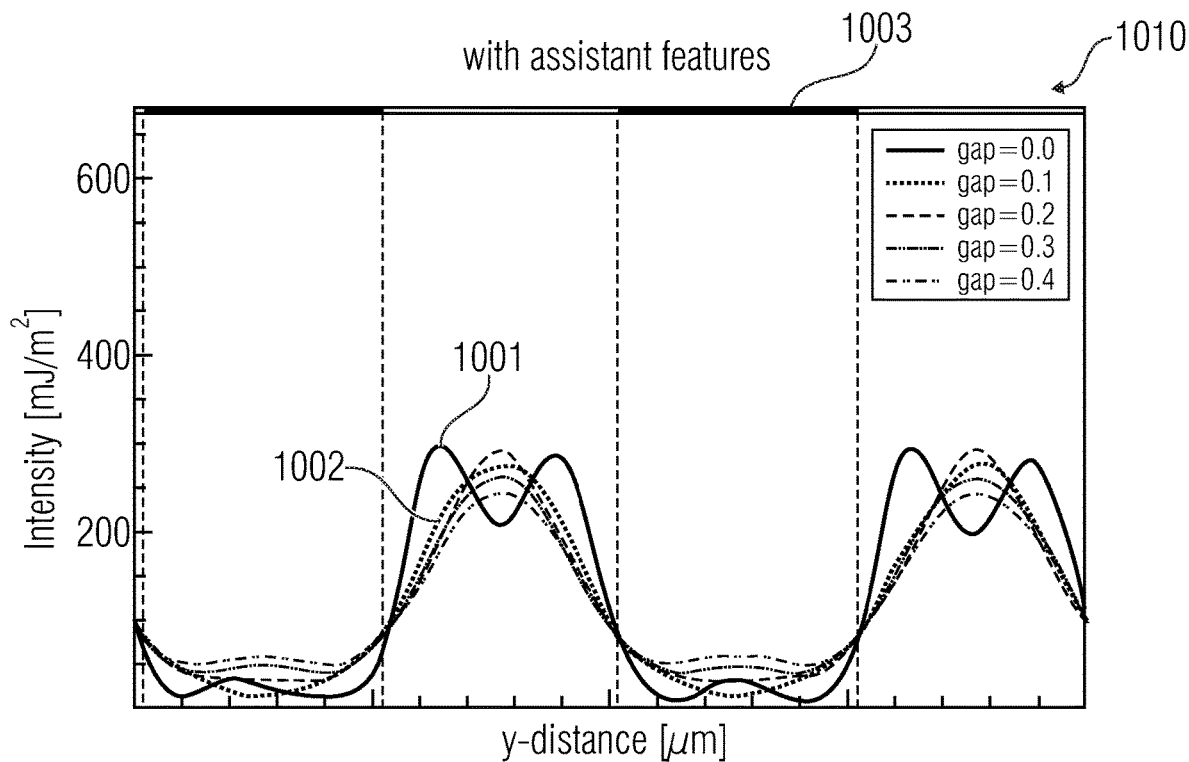
FIG. 10B shows a diagram representing the intensity distribution versus y-distance during lithography with assistant features.

Simulations of the outer finger structures 112a are shown in FIGS. 10A and 10B. The diagram 1000 of FIG. 10A and the diagram 1010 of FIG. 10B show the intensity distribution versus y-distance at the outermost finger structure 112a of the IDA pattern array 900. The different curves are the intensity values for different gap distances between mask and wafer.

The diagram 1000 of FIG. 10A shows the intensity distribution of an array comprising finger structures with a lateral width of about 500 nm and with gaps therebetween, the gaps having a lateral distance of about 500 nm. The black bars 1003 on the top show the chromium areas of the mask. The different curves in the diagram 1000 indicate the influence on intensity by varying the gap between mask and wafer.

A first curve 1001 indicates a perfect contact between mask and wafer (gap 0.0 µm). A second line 1002 shows a gap of 0.1 µm and is more realistic to the actual exposure situation. The black bars 1003 on the top indicating the chromium layer of the mask, where the light is blocked during exposure.

By analyzing the diagram 1000, it can be seen from line 1002 (gap of about 0.1 µm) that the intensity distribution of the outermost first finger 112a is 15 mJ/cm$^2$ higher than of the adjacent (more inner) second finger 112b. It can also be seen from line 1001 (gap of about 0.0 µm) that the intensity distribution of the outermost first finger 112a is even higher (60 mJ/cm$^2$).

Furthermore, the intensity at the edges of the unexposed sectors is 20 mJ/cm$^2$ higher than the sectors in the finger array. This results in an enlargement of the CD of about 30 nm. For nano IDA structures this circumstance would result in a short-circuiting of the outer finger.

FIG. 10B shows a diagram 1010 of intensity distribution with assistant features. It can be seen that a homogeneous intensity distribution can be obtained by adding three assistant features (two features are showing still some intensity differences).

As mentioned before, the lateral width of the gap, i.e. the gap width, between top portions of the deposited material can be controlled by varying the thickness of the deposited material. For example, the thicker the layer of deposited material, the thinner the gap width gets.

For the fabrication of critical dimension of the gap width in the sub-micron or nanometer range, lithography techniques are used in conventional technology. However, such conventional methods do not provide the line width roughness (LWR) that may be used in order to realize structures in the range of 100 nanometers or even less.

According to the invention, the initial structure (e.g. fabricated by mask aligner lithography and subsequent dry etching step) already has a quite high LWR of about 50 nm. Due to the fact that the deposition process, for example a sputtering process, further smoothens out the initial structures, a better LWR can be realized for the electrode structures. For example, an initial 520 nm structure that comprises a LWR of about 50 nm shows a LWR of about 20 nm after sputtering.

Figure 11C:
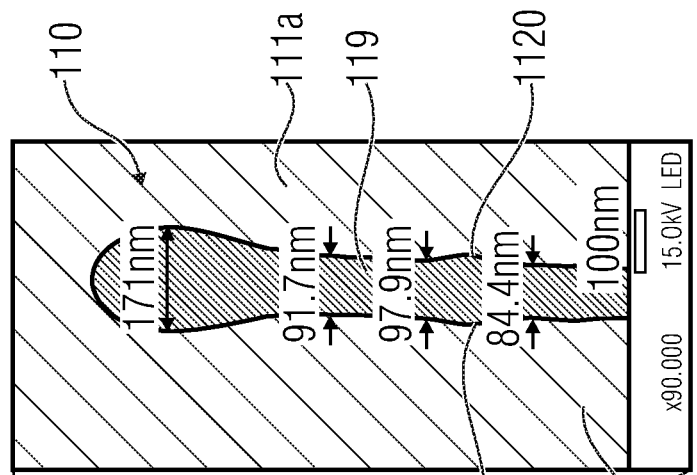
FIG. 11C shows a further SEM image which is a close up of a part of FIG. 11B.
Figure 11B:
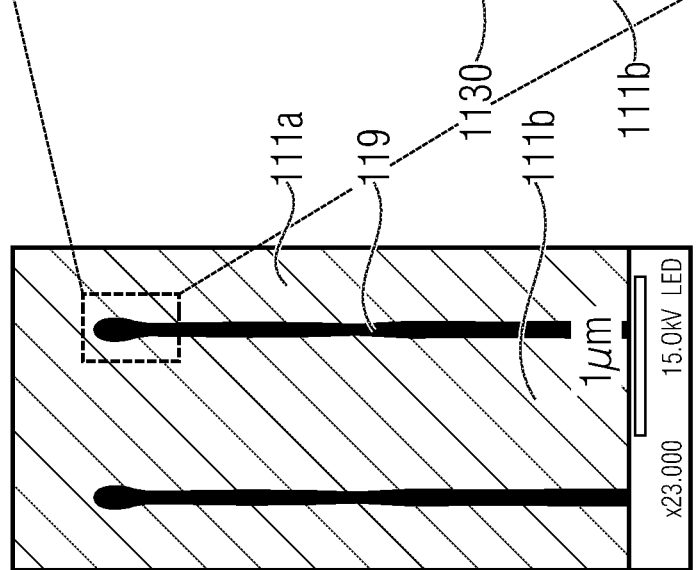
FIG. 11B shows an SEM image showing a close up of a part of the electrode structure of FIG. 11A.
Figure 11A:
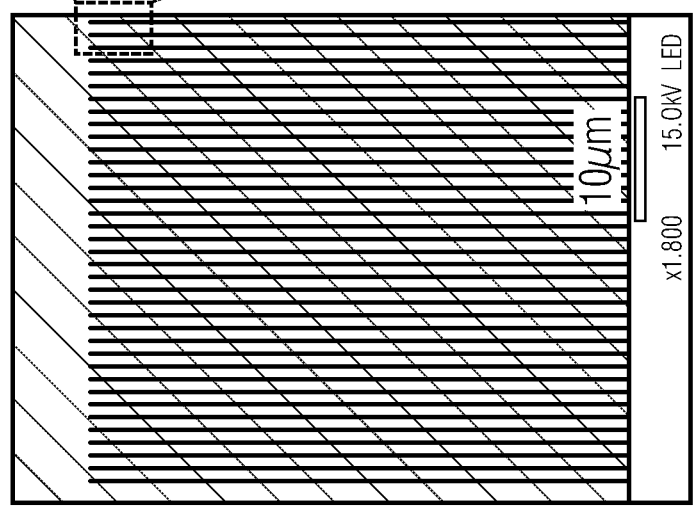
FIG. 11A shows an SEM image of an electrode structure according to an embodiment.

FIGS. 11A, 11B and 11C show SEM pictures of an electrode array 900 and magnified details of the electrode array 900.

The electrode array 900 shown in FIG. 11A comprised elevated regions (not visible) with a lateral width of about 520 nm and gaps therebetween, the gaps having a lateral distance of about 520 nm. The electrode array 900 is depicted after deposition of 500 nm SiO$_2$. As a result, a nearly defect free area with gaps 119 of 100 nm width is achieved.

FIG. 11B shows a detail view of two line ends. As FIGS. 11A to 11C show a top view, only top portions 111a, 111b of the deposited material 110 are visible, as well as a gap 119 formed between adjacent top portions 111a, 111b.

FIG. 11C shows a further close up view of one line end. As can be seen, the gap 119 formed between adjacent top portions 111a, 111b of deposited material 110 comprises a lateral width of about 100 nm. Furthermore, the above mentioned smoothening of the lateral edges due to the deposition step can be seen. Adjacent areas, i.e. the lateral edges 1120 and 1130 of the adjacent top portions 111a, 111b comprise a LWR of about 20 nm after the deposition step.

After depositing the material, the array 900 was provided with electrodes by evaporation of conductive electrode material. After evaporation the wafer was spin-coated with SU8-3005 with a final thickness of 5 µm. The soft bake was performed at 95° C. for 3 minutes on a hotplate in contact mode. Then the wafer was exposed for 90 seconds on a mask aligner in hard contact mode (i-line filter for illumination). The utilized mask defines the measurement areas and the contact pads. After exposure a post exposure bake of 2 min at 95° C. was performed. For development PGMEA was used and 1 min is sufficient to dissolve the unexposed areas. The rinsing was done with IPA and DI water. The contact and measurement areas are defined and an on-chip reference electrode is prepared by electroplating of Ag and AgCl (reference). The final step for providing a biosensor is to dice the individual chips by a dicing saw or laser.

Figure 12:
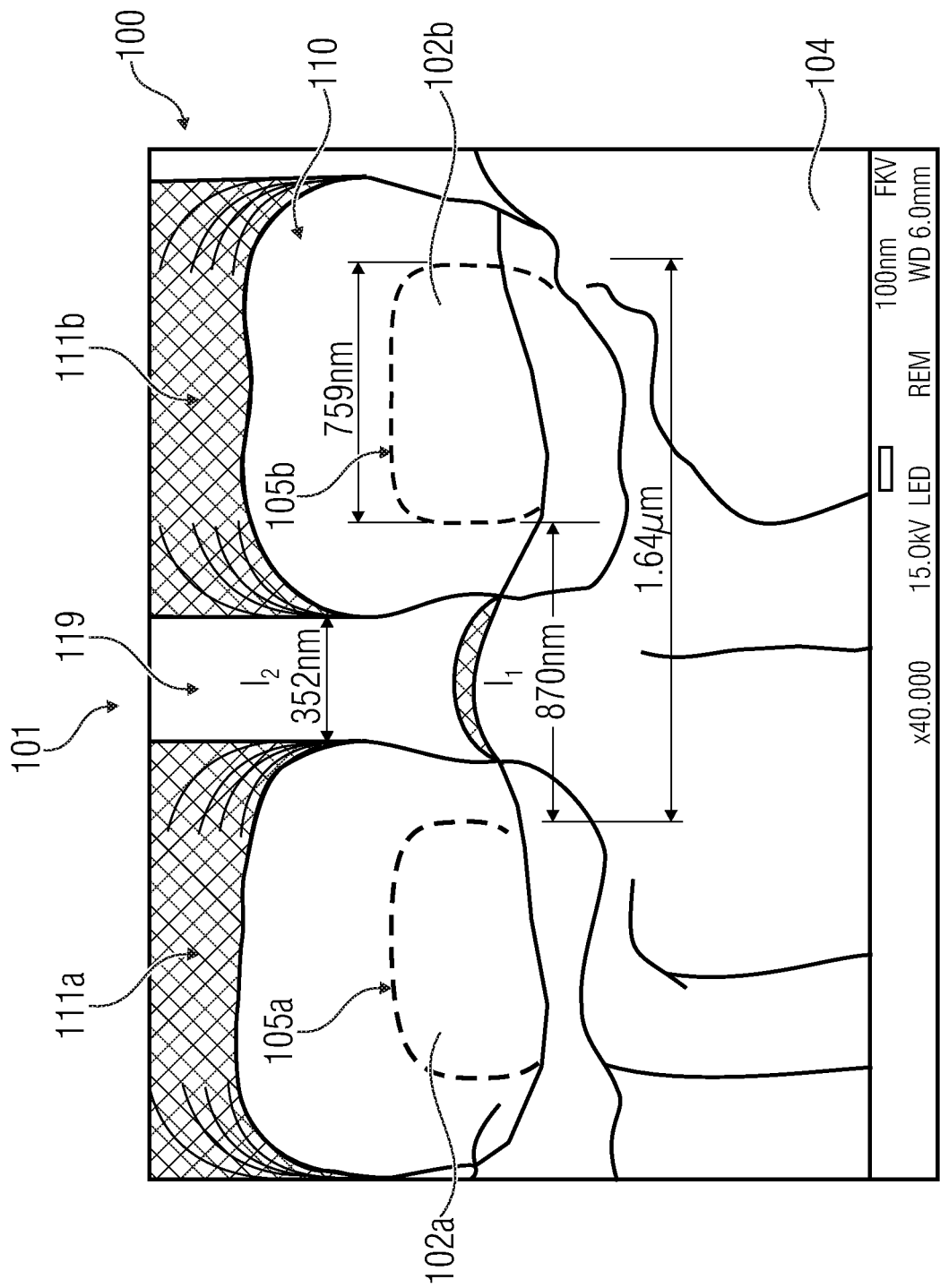
FIG. 12 shows an SEM image of an electrode structure according to an embodiment in which a photoresist is used as elevated regions.

Furthermore, an additional fabrication process without dry etching was analyzed which is shown in FIG. 12. FIG. 12 shows an SEM cross section of a Photoresist SPR 9555 CM with a thickness of 600 nm with a deposited 400 nm thick SiO$_2$ layer. The gap $I_1$ between the photoresist is 870 nm at a period of 1.64 µm (1:1).

Instead of transferring the photolithography pattern into the silicon substrate, the pattern itself serves as initial structure. This approach is similar to the mass production process flow where a plastic substrate is used. Both methods contain temperature sensitive materials, which have to withstand the temperatures during the deposition and the evaporation process. After the deposition process, the photoresist did not show any degradation or profile deformations and the undercut was formed correctly. The deposited SiO$_2$ layer protects the photoresist underneath in further process steps (evaporation step and lithography steps for insulating the electrodes).

FIG. 12 shows an electrode structure 100 comprising an initial structure 101. The initial structure 101 comprises two elevated regions 102a, 102b. The elevated regions 102a, 102b comprise the photoresist SPR 9555 CM with a thickness of 600 nm, as mentioned above. Particularly, the elevated regions 102a, 102b may be made of the photoresist structure that has been applied onto the substrate 104.

At least top portions 105a, 105b of the two elevated regions 102a, 102b are separated by a first lateral distance $I_1$, which is 870 nm in this example.

Material 110 has been deposited onto the elevated structures 102a, 102b of photoresist. Accordingly, a gap 119 is formed between adjacent top portions 111a, 111b of the deposited material 110. The gap comprises a second lateral width $I_2$ of 352 nm.

In a last step, electrodes (not shown) are applied onto the top portions 111a, 111b of the deposited material. The electrodes may be applied by evaporating conductive material.

Summarizing, conventional fabrication methods define the critical structures by photolithography. According to the invention, the critical dimension (gap between the electrodes) is defined not primarily by photolithography, but by a precise and easy controllable deposition process, such as sputtering or the like. The thickness of the deposited layer (e.g. by sputtering) can be controlled in the nanometer range (or even less than a nanometer). This fact allows a very precise adjustment of the gap between the electrodes.

Furthermore, as already mentioned, the spacing between the electrodes is defined by the deposition process. This allows a variation of the gap without a change in mask design by adjusting the thickness of the deposited layer. With the traditional fabrication method, where photolithography defines the electrode distance, a new mask has to be designed. This involves time for designing and costs arise for the mask fabrication.

Another advantage of this fabrication process is the elimination of a lift-off process. The lift-off process is one of the critical steps in nano-electrode fabrication. If there is a short-circuit, then it is most probably generated in this step because metal residue is unintentionally deposited and the device is useless. By completely eliminating the lift-off process, no metal residue is generated and therefore no short-circuit can be created.

The inventive method is a combination of providing an initial structure and two deposition processes. The initial structure can be provided by lithography or any other structuring technique. For mass production, the initial structure can be fabricated with injection molding with an appropriate stamp. The substrate material is relatively uncritical, i.e. it only has to provide temperature stability in a deposition process, this allows polymers to be used as a substrate. The first deposition process is done in short distances between substrate and target to generate the undercut profile. The deposited material may be a dielectric to prevent conduction between the electrodes. The second deposition process is an evaporation step where substrate and target are positioned at rather large distance. The evaporation step is used for forming the electrodes.

$SiO_2$ is mentioned within this document only as an example, i.e. the provision or use of $SiO_2$ for the depositing step is not mandatory.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] J. P. Metters, R. O. Kadara, and C. E. Banks, "Electroanalytical properties of screen printed graphite microband electrodes," Sens. Actuators B Chem., vol. 169, pp. 136-143, July 2012.

[2] S. Partel, M. Mayer, P. Hudek, C. Dincer, J. Kieninger, G. A. Urban, K. Motzek, and L. Matay, "Fabrication process development for a high sensitive electrochemical IDA sensor," Microelectron. Eng., vol. 97, no. 0, pp. 235-240, September 2012.

[3] F. Tan, J. P. Metters, and C. E. Banks, "Electroanalytical applications of screen printed microelectrode arrays," Sens. Actuators B Chem., vol. 181, pp. 454-462, May 2013.

[4] P. J. Welford, J. Freeman, S. J. Wilkins, J. D. Wadhawan, C. E. W. Hahn, and R. G. Compton, "Laminated Microelectrodes: A Simple Approach to the Construction of Inexpensive Microelectrodes with a Variety of Geometries," Anal. Chem., vol. 73, no. 24, pp. 6088-6092, December 2001.

[5] S. Partel, S. Kasemann, P. Choleva, C. Dincer, J. Kieninger, and G. A. Urban, "Novel fabrication process for sub-micron interdigitated electrode arrays for highly sensitive electrochemical detection," Sens. Actuators B Chem., vol. 205, pp. 193-198, December 2014.

[6] L H D Skjolding et al, "Characterisation of nano-interdigitated electrodes," J. Phys. Conf. Ser., vol. 100, no. 5, p. 052045, 2008.

[7] K. Ueno, M. Hayashida, J.-Y. Ye, and H. Misawa, "Fabrication and electrochemical characterization of interdigitated nanoelectrode arrays," Electrochem. Commun., vol. 7, no. 2, pp. 161-165, 2005.

[8] Samarao, A. K., Rust, M. J., and Ahn, C. H., "Rapid Fabrication of a Nano Interdigitated Array Electrode and its Amperometric Characterization as an Electrochemical Sensor," Sens. 2007 IEEE, pp. 644-647.

[9] C. Santschi, M. Jenke, P. Hoffmann, and J. Brugger, "Interdigitated 50 nm Ti electrode arrays fabricated using XeF2 enhanced focused ion beam etching," Nanotechnology, vol. 17, no. 11, pp. 2722-2729, June 2006.

[10] Y. Lanyon and D. Arrigan, "Recessed nanoband electrodes fabricated by focused ion beam milling," Sens. Actuators B Chem., vol. 121, no. 1, pp. 341-347, January 2007.

[11] M. Beck, "Nanoelectrochemical transducers for (bio-) chemical sensor applications fabricated by nanoimprint lithography," Microelectron. Eng., vol. 73-74, pp. 837-842, June 2004.

[12] A. Yokoo, H. Namatsu, and M. Oda, "Nanoelectrode Lithography," MRS Proc., vol. 961, January 2006.

[13] M. E. Sandison and J. M. Cooper, "Nanofabrication of electrode arrays by electron-beam and nanoimprint lithographies," Lab. Chip, vol. 6, no. 8, p. 1020, 2006.

[14] P. Van Gerwen, W. Laureyn, W. Laureys, G. Huyberechts, M. Op De Beeck, K. Baert, J. Suls, W. Sansen, P. Jacobs, L. Hermans, and R. Mertens, "Nanoscaled interdigitated electrode arrays for biochemical sensors," Sens. Actuators B Chem., vol. 49, no. 1-2, pp. 73-80, June 1998.

[15] B. Städler, H. H. Solak, S. Frerker, K. Bonroy, F. Frederix, J. Vörös, and H. M. Grandin, "Nanopatterning of gold colloids for label-free biosensing," Nanotechnology, vol. 18, no. 15, p. 155306, April 2007.

[16] F. J. del Campo, L. Abad, X. Illa, E. Prats-Alfonso, X. Borrisé, J. M. Cirera, H.-Y. Bai, and Y.-C. Tsai, "Determination of heterogeneous electron transfer rate constants at interdigitated nanoband electrodes fabricated by an optical mix-and-match process," Sens. Actuators B Chem., vol. 194, pp. 86-95, April 2014.

[17] J. S. Shim, M. J. Rust, and C. H. Ahn, "A large area nano-gap interdigitated electrode array on a polymer substrate as a disposable nano-biosensor," J. Micromechanics Microengineering, vol. 23, no. 3, p. 035002, March 2013.

The invention claimed is:

1. A method of manufacturing an electrode structure, the method comprising:
   providing an initial structure, the initial structure comprising at least two elevated regions extending from a substrate, wherein top portions of the two elevated regions are separated by a first lateral distance,
   depositing a dielectric material by means of physical vapor deposition onto the elevated regions such that adjacent top portions of the deposited dielectric material are separated by a second lateral distance that is smaller than the first lateral distance, and
   applying electrodes onto the top portions of the dielectric material,
   wherein the dielectric material deposited onto an elevated region comprises a cone shape having a first lateral width adjacent to the elevated region and a second lateral width remote from the elevated region, wherein the first lateral width is smaller than the second lateral width.

2. The method according to claim 1, wherein depositing material onto the elevated regions comprises sputtering material onto the elevated regions.

3. The method according to claim 1, wherein the elevated regions are permanently maintained at the initial structure.

4. The method according to claim 1, wherein the electrodes are applied onto the top portions of the deposited material by evaporation of conductive material.

5. The method according to claim 1, wherein the elevated regions comprise an aspect ratio of width to height of about 1:1.

6. The method according to claim 1, wherein the top portions of the elevated regions comprise a lateral width of about 1 µm and the first lateral distance between the top portions of the elevated regions is about 1 µm.

7. The method according to claim 1, wherein the first lateral distance between the elevated regions is between about 3 µm and about 1 µm, or between about 1 µm and about 800 nm, or between about 800 nm and 500 nm.

8. The method according to claim 1, wherein the electrode structure comprises electrodes that are separated by an electrode gap, the electrode gap comprising a lateral distance that is less than about 100 nm, or less than about 50 nm, or between about 50 nm and 20 nm.

9. The method according to claim 1, wherein the deposited material comprises a thickness between about 400 nm and about 700 nm.

10. The method according to claim 1, wherein the method comprises providing a material layer that is arranged between the elevated regions and the deposited material.

11. The method according to claim 1, wherein the initial structure is formed by injection molding, or by hot embossing, or by nano-imprinting, or by dry-etching, or by wet-etching.

12. The method according to claim 1, wherein adjacent areas of top portions of the deposited material provide a Line Width Roughness of about 20 nm.

* * * * *